(12) United States Patent
Kim et al.

(10) Patent No.: US 10,373,884 B2
(45) Date of Patent: Aug. 6, 2019

(54) FAN-OUT SEMICONDUCTOR PACKAGE FOR PACKAGING SEMICONDUCTOR CHIP AND CAPACITORS

(71) Applicant: SAMSUNG ELECTRONICS CO., LTD., Suwon-si (KR)

(72) Inventors: Han Kim, Suwon-si (KR); Mi Ja Han, Suwon-si (KR); Kang Heon Hur, Suwon-si (KR); Young Gwan Ko, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/278,248

(22) Filed: Sep. 28, 2016

(65) Prior Publication Data
US 2017/0287853 A1    Oct. 5, 2017

(30) Foreign Application Priority Data

Mar. 31, 2016    (KR) .................. 10-2016-0039229
Aug. 24, 2016    (KR) .................. 10-2016-0107766

(51) Int. Cl.
*H01L 23/31*    (2006.01)
*H01L 23/528*   (2006.01)
(Continued)

(52) U.S. Cl.
CPC ...... *H01L 23/3114* (2013.01); *H01L 23/3128* (2013.01); *H01L 23/49822* (2013.01);
(Continued)

(58) Field of Classification Search
CPC .............. H01L 23/642; H01L 23/3114; H01L 23/5383; H01L 23/5384; H01L 23/5386;
(Continued)

(56) References Cited

U.S. PATENT DOCUMENTS

| | | |
|---|---|---|
| 6,713,860 B2 | 3/2004 | Li |
| 2002/0074643 A1 | 6/2002 | Yamazaki et al. |

(Continued)

FOREIGN PATENT DOCUMENTS

| | | |
|---|---|---|
| JP | 2002-164462 A | 6/2002 |
| JP | 2006-059992 A | 3/2006 |

(Continued)

OTHER PUBLICATIONS

Japanese Office Action issued in corresponding Japanese Patent Application No. 2016-199165, dated Feb. 20, 2018, with English Translation.

(Continued)

*Primary Examiner* — Laura M Menz
*Assistant Examiner* — Candice Chan
(74) *Attorney, Agent, or Firm* — Sughrue Mion, PLLC

(57) ABSTRACT

The fan-out semiconductor package includes: a semiconductor chip having an active surface having a connection pad disposed thereon and an inactive surface disposed to oppose the active surface; a first capacitor disposed adjacently to the semiconductor chip; an encapsulant at least partially encapsulating the first connection member and the semiconductor chip; a first connection member disposed on the encapsulant, the first capacitor, and the semiconductor chip, and a second capacitor disposed on the other surface of the first connection member opposing one surface of the first connection member on which the semiconductor chip is disposed, wherein the first connection member includes a redistribution layer electrically connected to the connection pad of the semiconductor chip, the first capacitor, and the second capacitor, and the first capacitor and the second capacitor are electrically connected to the connection pad through a common power wiring of the redistribution layer.

24 Claims, 26 Drawing Sheets

(51) Int. Cl.
*H01L 23/538* (2006.01)
*H01L 23/498* (2006.01)
*H01L 23/64* (2006.01)

(52) U.S. Cl.
CPC .... *H01L 23/49827* (2013.01); *H01L 23/5283* (2013.01); *H01L 23/5383* (2013.01); *H01L 23/5384* (2013.01); *H01L 23/5386* (2013.01); *H01L 23/5389* (2013.01); *H01L 23/642* (2013.01); *H01L 2224/02379* (2013.01); *H01L 2224/04105* (2013.01); *H01L 2224/12105* (2013.01); *H01L 2224/16227* (2013.01); *H01L 2224/24195* (2013.01); *H01L 2224/32225* (2013.01); *H01L 2224/48091* (2013.01); *H01L 2224/48227* (2013.01); *H01L 2224/73265* (2013.01); *H01L 2225/1035* (2013.01); *H01L 2225/1041* (2013.01); *H01L 2225/1058* (2013.01); *H01L 2924/15311* (2013.01); *H01L 2924/18162* (2013.01); *H01L 2924/19106* (2013.01)

(58) Field of Classification Search
CPC ............ H01L 23/5389; H01L 23/4824; H01L 23/485; H01L 23/5283; H01L 2224/02379
See application file for complete search history.

(56) References Cited

U.S. PATENT DOCUMENTS

| | | |
|---|---|---|
| 2005/0156280 A1 | 7/2005 | Patel et al. |
| 2006/0040463 A1 | 2/2006 | Sunohara |
| 2009/0243065 A1 | 10/2009 | Sugino et al. |
| 2009/0294942 A1 | 12/2009 | Palmer et al. |
| 2010/0200975 A1 | 8/2010 | Chino |
| 2010/0214751 A1 | 8/2010 | Aoki et al. |
| 2010/0295138 A1* | 11/2010 | Montanya Silvestre ............. B81C 1/00246 257/415 |
| 2013/0217189 A1 | 8/2013 | Sasaki et al. |
| 2014/0015131 A1 | 1/2014 | Meyer et al. |
| 2014/0077361 A1 | 3/2014 | Lin et al. |
| 2014/0077364 A1* | 3/2014 | Marimuthu ......... H01L 23/5389 257/737 |
| 2014/0252573 A1 | 9/2014 | Lin et al. |
| 2015/0179570 A1 | 6/2015 | Marimuthu et al. |
| 2015/0371951 A1 | 12/2015 | Yeh et al. |
| 2016/0329299 A1* | 11/2016 | Lin ..................... H01L 23/5226 |

FOREIGN PATENT DOCUMENTS

| | | |
|---|---|---|
| JP | 2007-005713 A | 1/2007 |
| JP | 2007-115862 A | 5/2007 |
| JP | 2010-186847 A | 8/2010 |
| JP | 2010-199171 A | 9/2010 |
| JP | 2011-514015 A | 4/2011 |
| JP | 2012-74505 A | 4/2012 |
| JP | 2013-168594 A | 8/2013 |
| JP | 2014-110337 A | 6/2014 |
| JP | 2015-88569 A | 5/2015 |
| KR | 10-2009-0028687 A | 3/2009 |
| TW | 201405765 A | 2/2014 |
| TW | 201411749 A | 3/2014 |
| TW | 201436074 A | 9/2014 |
| TW | 201526125 A | 7/2015 |
| TW | 201601248 A | 1/2016 |

OTHER PUBLICATIONS

Taiwanese Office Action issued in corresponding Taiwanese Patent Application No. 105132116, dated Jan. 10, 2018, with English Translation.
Japanese Office Action dated Oct. 23, 2018 issued in Japanese Patent Application No. 2016-199165 (with English translation).
Korean Notice of Office Action dated Mar. 11, 2019 issued in Korean Patent Application No. 10-2016-0107766 (with English translation).

* cited by examiner

I-I'

'A'

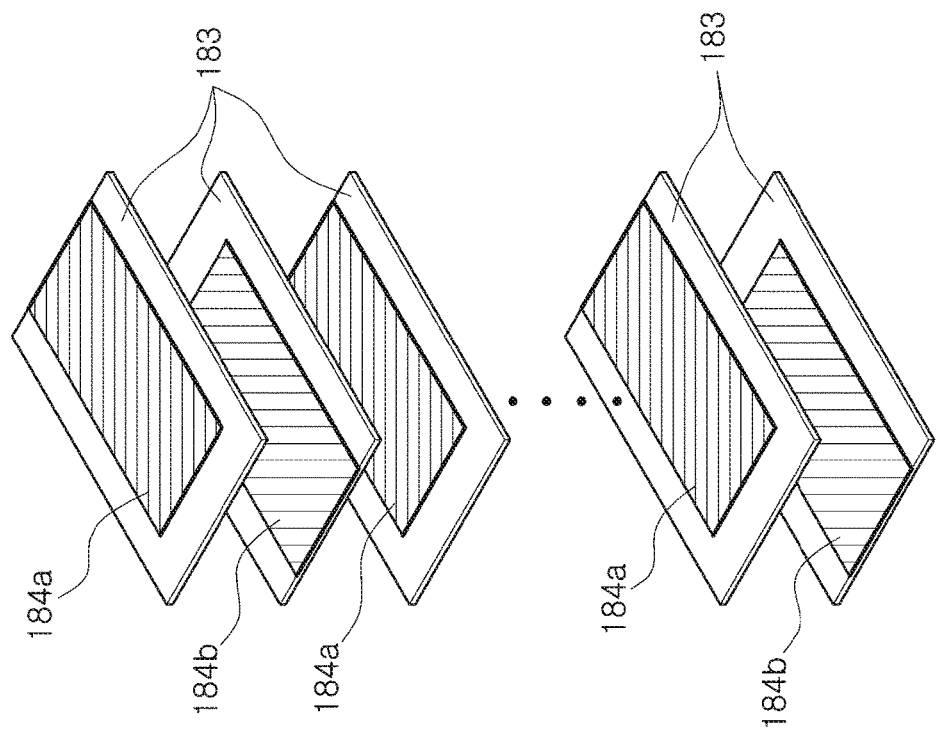
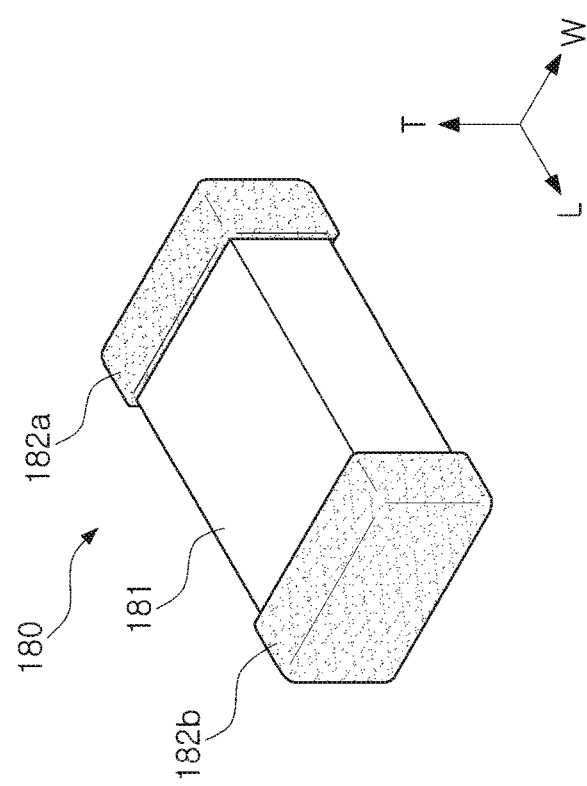
FIG. 15A
FIG. 15B

II-II'

'C'

FAN-OUT SEMICONDUCTOR PACKAGE FOR PACKAGING SEMICONDUCTOR CHIP AND CAPACITORS

CROSS-REFERENCE TO RELATED APPLICATION

This application claims benefit of priority to Korean Patent Application Nos. 10-2016-0039229 filed on Mar. 31, 2016, and 10-2016-0107766, filed on Aug. 24, 2016, in the Korean Intellectual Property Office, the disclosures of which are incorporated herein by reference in their entirety.

BACKGROUND

1. Field

The present disclosure relates to a fan-out semiconductor package in which connection terminals may be extended outwardly of a region in which a semiconductor chip is disposed.

2. Description of Related Art

Recently, a significant recent trend in the development of technology related to semiconductor chips is reducing the size of semiconductor chips. Therefore, in the field of package technology, in accordance with a rapid increase in demand for small sized semiconductor chips, or the like, the implementation of a semiconductor package having a compact size while including a plurality of pins has been demanded.

One type of package technology suggested to satisfy the technical requirements as described above is a fan-out semiconductor package. Such a fan-out package may be useful in terms of the implementation of a large number of pins while having a compact size by redistributing a connection terminal outwardly of a region in which a semiconductor chip is disposed.

Meanwhile, the market for portable electronic devices such as netbook PCs, tablet PCs, smartphones, and handheld game devices comprises most of the market for semiconductor devices. As such, as demand for high-speed portable electronic devices increases, portable electronic devices have lower degrees of power consumption. In a high-speed switching state, portable electronic devices are required to be able to readily receive power.

SUMMARY

An aspect of the present disclosure may provide a fan-out semiconductor package that may improve levels of input impedance in a low frequency domain and a high frequency domain regardless of limited capacitor space.

According to an aspect of the present disclosure, a fan-out semiconductor package may be provided, in which capacitors may be disposed on one surface and the other surface of a connection member including a redistribution layer, respectively, and may be commonly connected to a power wiring in the redistribution layer, thus being electrically connected to a connection pad of a semiconductor chip.

According to an aspect of the present disclosure, a fan-out semiconductor package may include: a semiconductor chip having an active surface having a connection pad disposed thereon and an inactive surface disposed to oppose the active surface; a first capacitor disposed adjacently to the semiconductor chip; an encapsulant at least partially encapsulating the first connection member and the non-active surface of the semiconductor chip; a first connection member disposed on the encapsulant, the first capacitor, and the active surface of the semiconductor chip, and a second capacitor disposed on the other surface of the first connection member opposing one surface of the first connection member on which the semiconductor chip is disposed, wherein the first connection member includes a redistribution layer electrically connected to the connection pad of the semiconductor chip, the first capacitor, and the second capacitor, and the first capacitor and the second capacitor are electrically connected to the connection pad through a common power wiring of the redistribution layer.

BRIEF DESCRIPTION OF DRAWINGS

The above and other aspects, features, and advantages of the present disclosure will be more clearly understood from the following detailed description taken in conjunction with the accompanying drawings, in which:

FIGS. 15A and 15B are schematic perspective views illustrating an example of a first capacitor;

DETAILED DESCRIPTION

Figure 1:
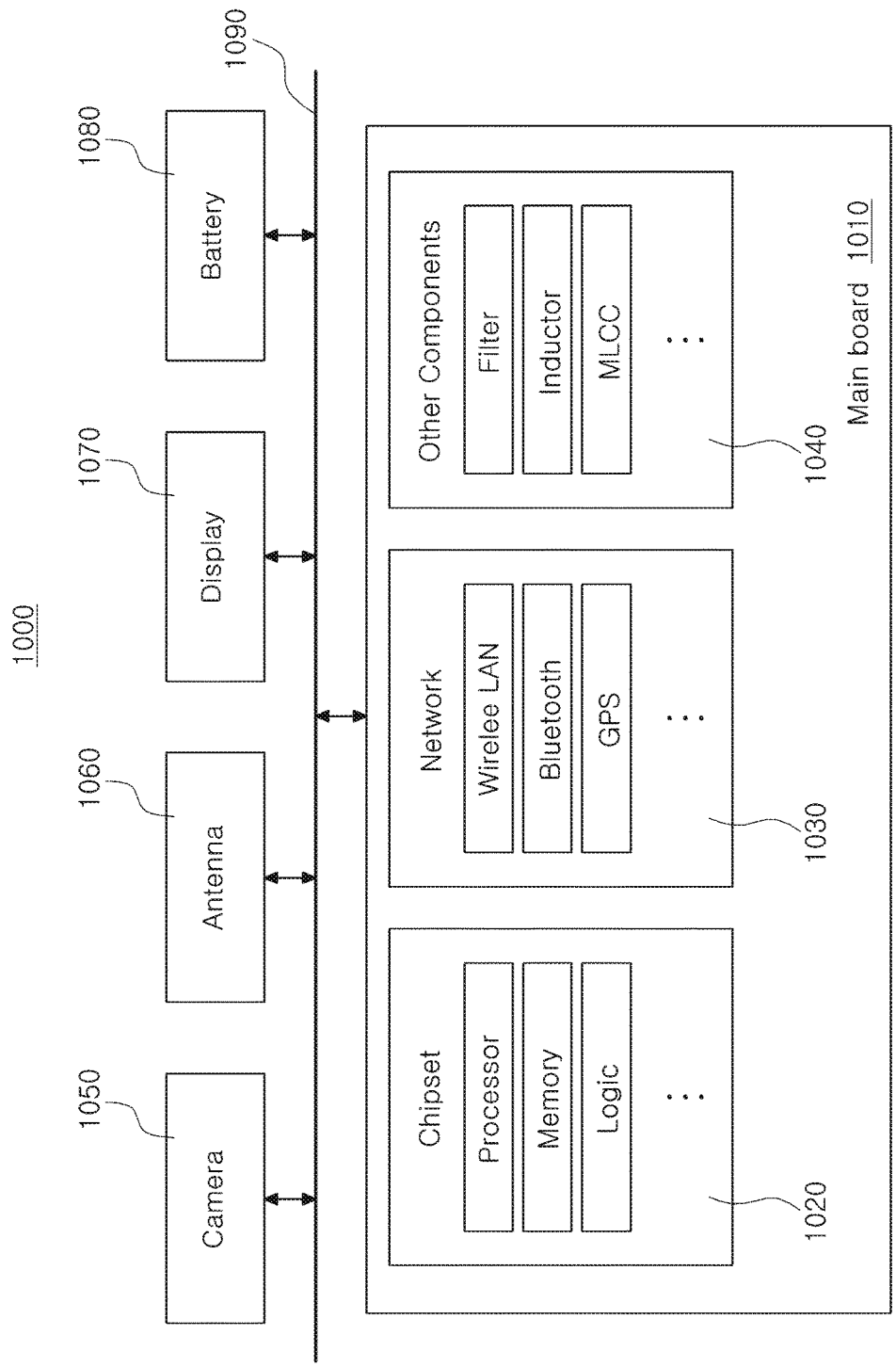
FIG. 1 is a schematic block diagram illustrating an example of an electronic device system.

Hereinafter, exemplary embodiments of the present disclosure will be described as follows with reference to the attached drawings. In the attached drawings, shapes, sizes, and the like, of components may be exaggerated or shortened for clarity.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

The meaning of a "connection" of a component to another component in the description includes an indirect connection through a third component as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the attached drawings. For example, a first connection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

Terms used herein are used only in order to describe an exemplary embodiment rather than limiting the present disclosure. In this case, singular forms include plural forms unless interpreted otherwise in a context.

Electronic Device

FIG. 1 is a schematic block diagram illustrating an example of an electronic device system.

Referring to FIG. 1, an electronic device 1000 may accommodate a mother board 1010. The mother board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on type of the electronic device 1000, the electronic device 1000 may include other components that may or may not be physically or electrically connected to the mother board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
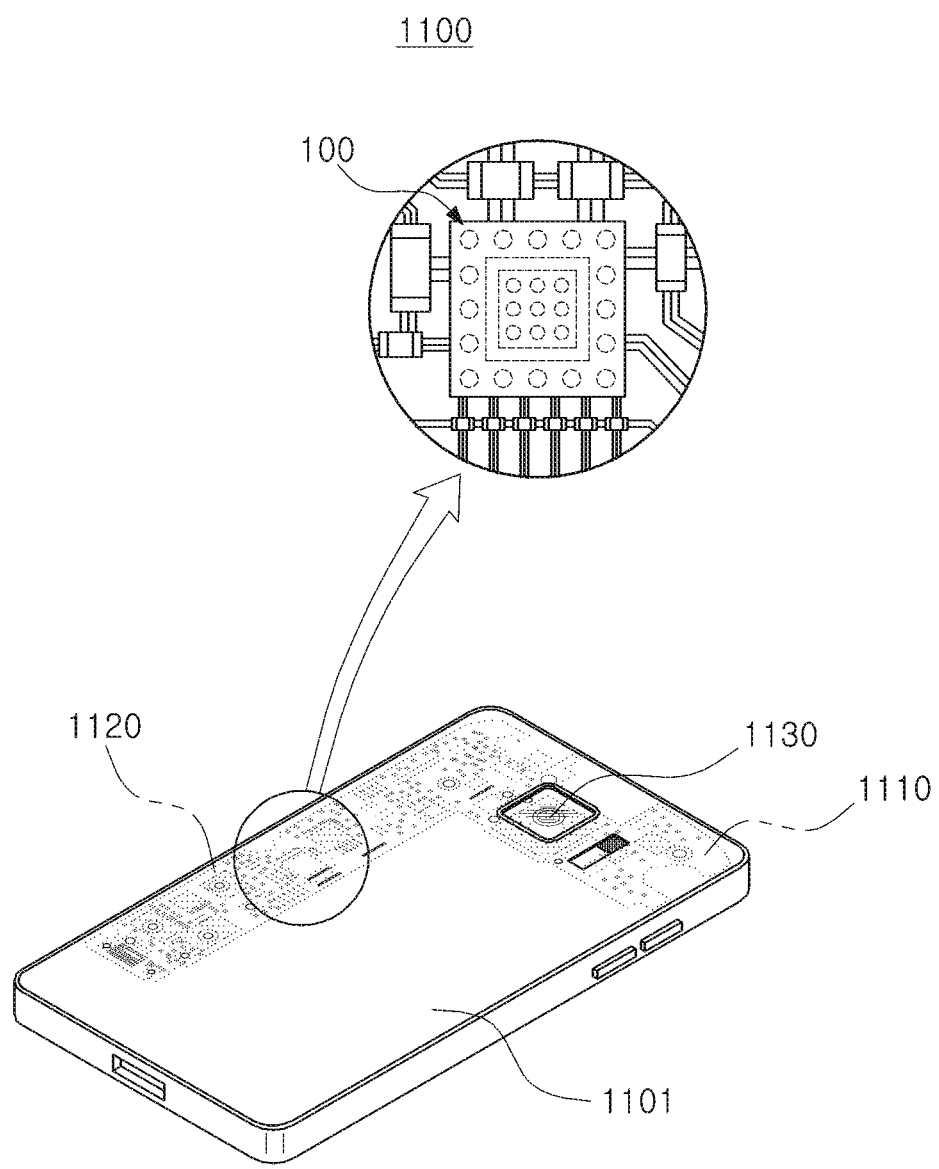
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as the camera module 1050, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself is not used, but is packaged and is used in an electronic device, or the like, in a packaged state.

Here, semiconductor packaging is required due to the existence of a difference in a circuit width between the semiconductor chip and a main board of the electronic device in terms of electrical connections. In detail, connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and a packaging technology for buffering a difference in a circuit width between the semiconductor chip and the main board is required.

A semiconductor package manufactured by the packaging technology may be divided into a fan-in semiconductor package and a fan-out semiconductor package depending on a structure and a purpose thereof.

The fan-in semiconductor package and the fan-out semiconductor package will hereinafter be described in more detail with reference to the drawings.

(Fan-In Semiconductor Package)

Figure 3B:
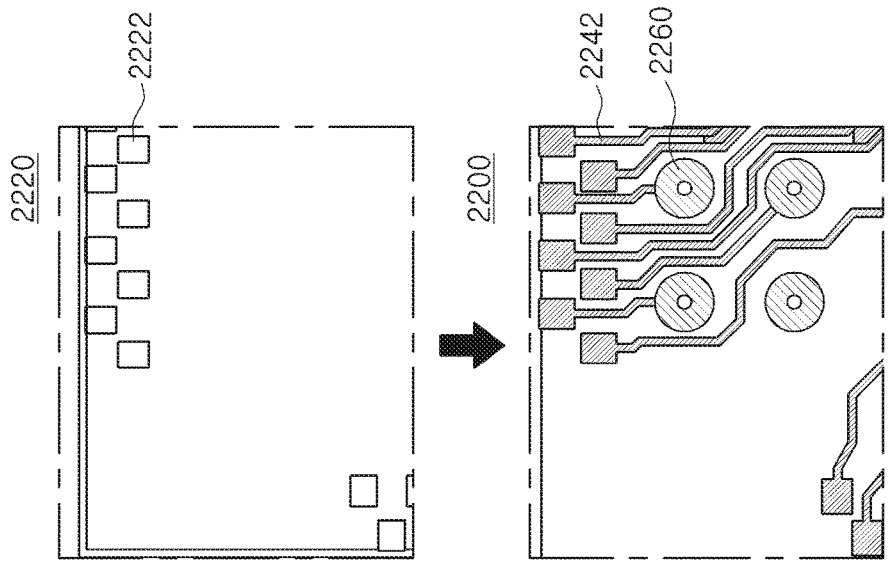
FIGS. 3A and 3B are schematic cross-sectional views illustrating states of a fan-in semiconductor package before and after being packaged.
Figure 3A:
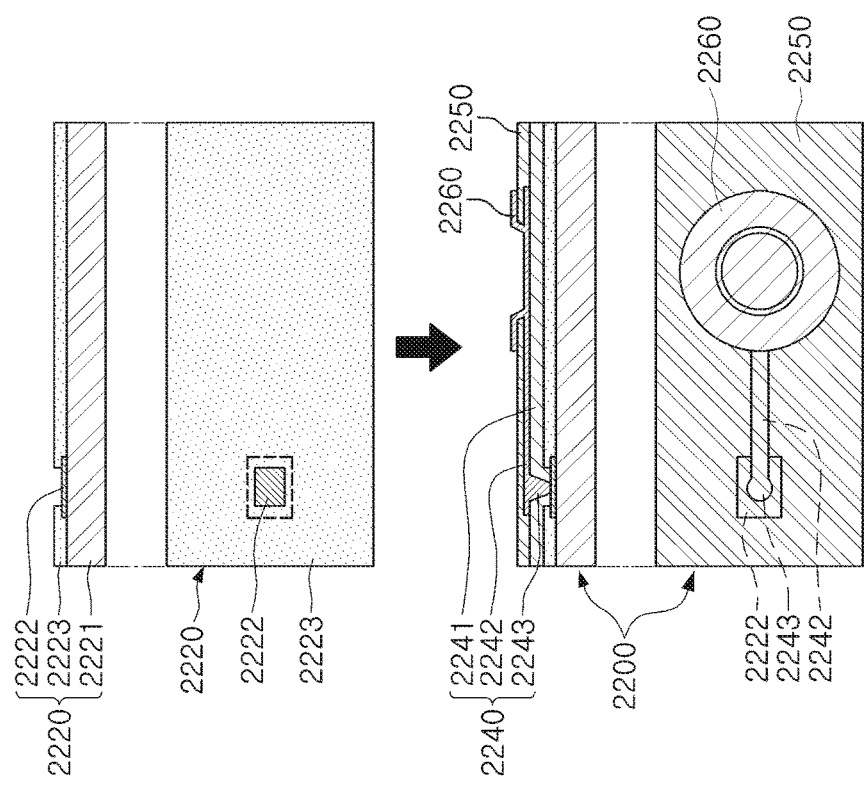

FIGS. 3A and 3B are schematic cross-sectional views illustrating states of a fan-in semiconductor package before and after being packaged.

Figure 4:
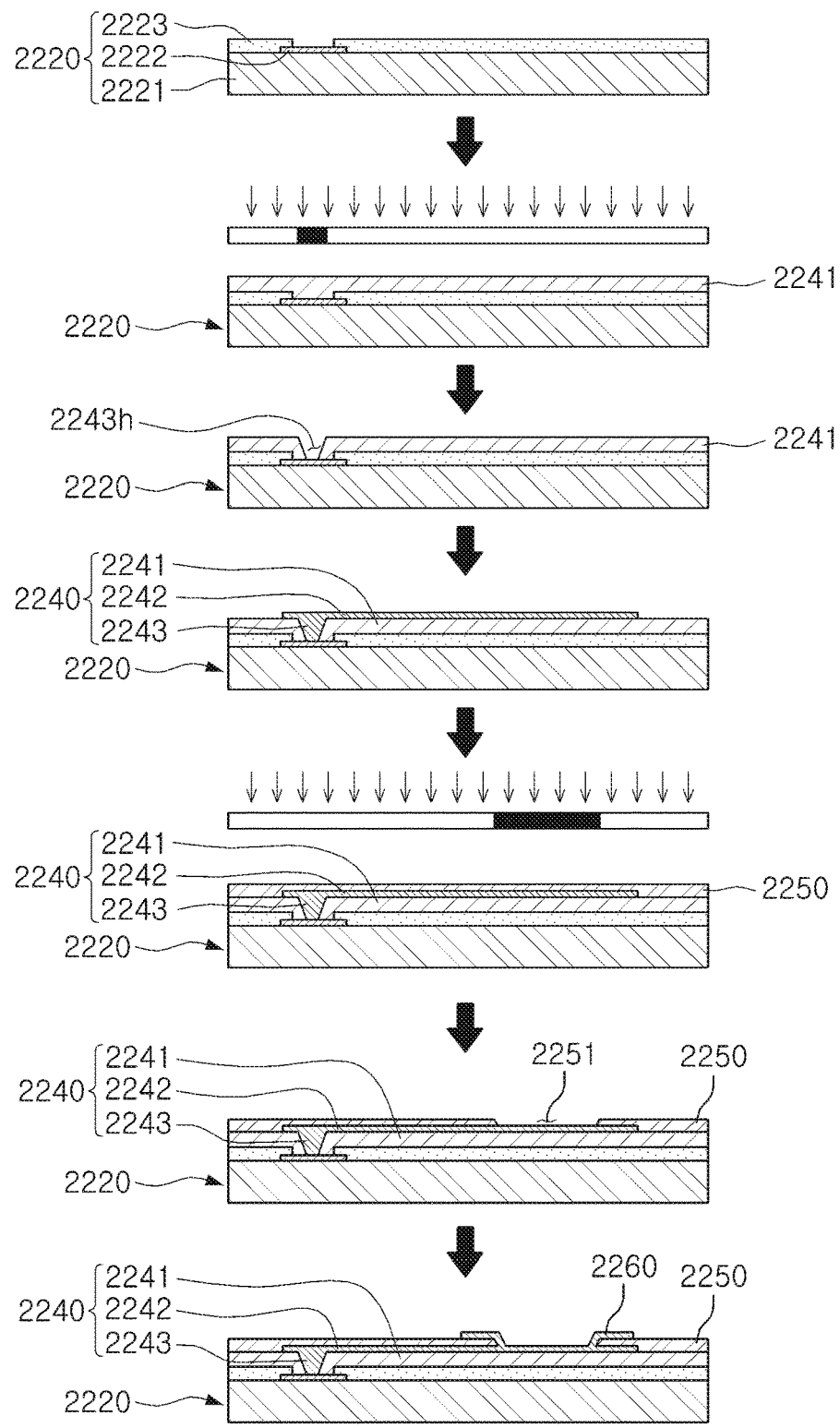
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. Here, since the connection pads 2222 are very small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in a smartphone have been manufactured in fan-in semiconductor package form. In detail, many elements mounted in the smartphone have been developed to implement a rapid signal transfer while having a compact size.

However, since all of the I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the main board of the electronic device.

Figure 5:
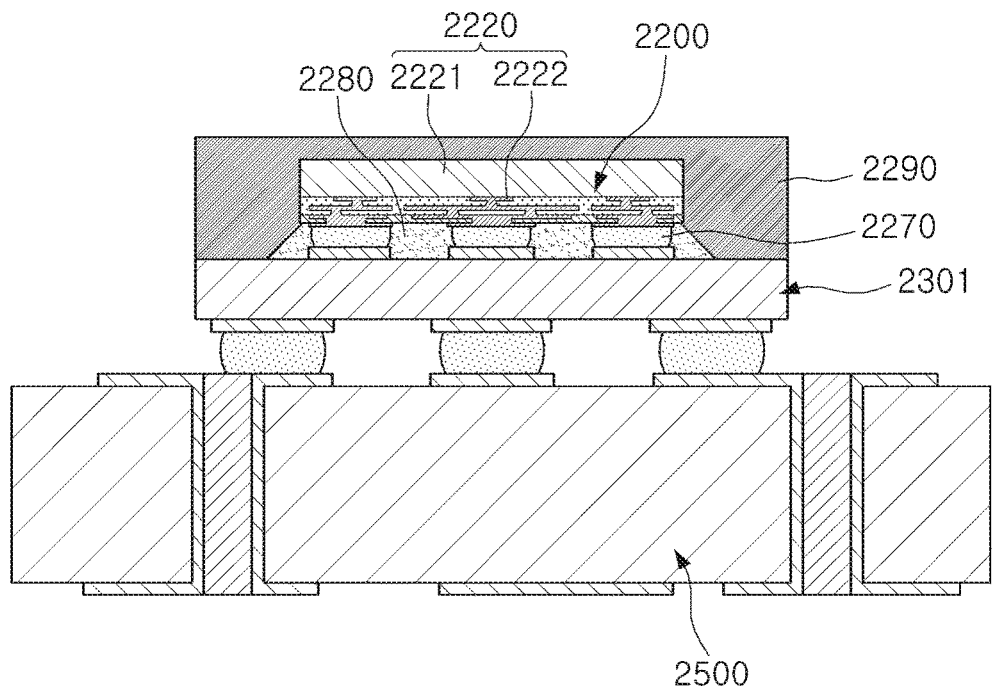
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
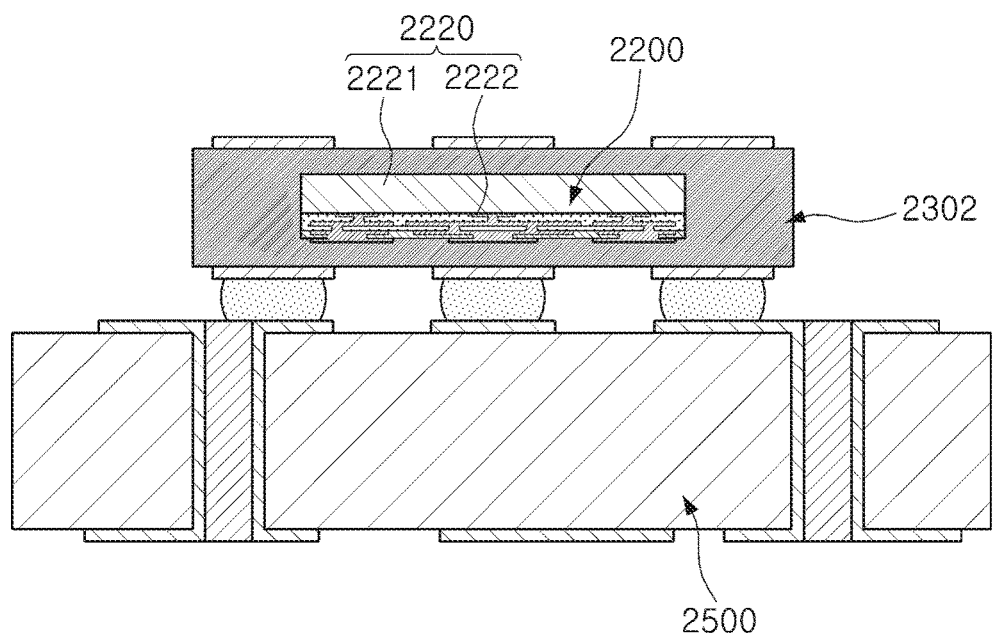
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be finally mounted on a main board 2500 of an electronic device in a state in which it is mounted on the interposer substrate 2301. Here, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

(Fan-Out Semiconductor Package)

Figure 7:
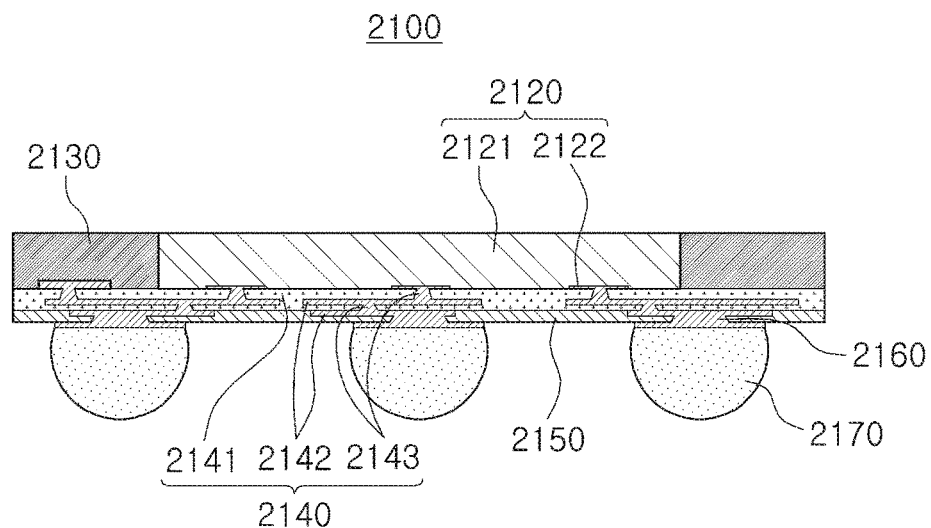
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed up to the outer side of the semiconductor chip 2120 by a connection member 2140. Here, a passivation layer 2150 may be further formed on the connection member 2140, and underbump metal layers 2160 may be further formed in openings of the passivation layer 2150. Solder balls 2170 may be further formed on the underbump metal layers 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed up outwardly of the semiconductor chip through the connection member formed on the semiconductor chip. As described above, in the fan-in semiconductor package, all of the I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed up to the outer side of the semiconductor chip through the connection member formed on the semiconductor chip as described above. Therefore, even though a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
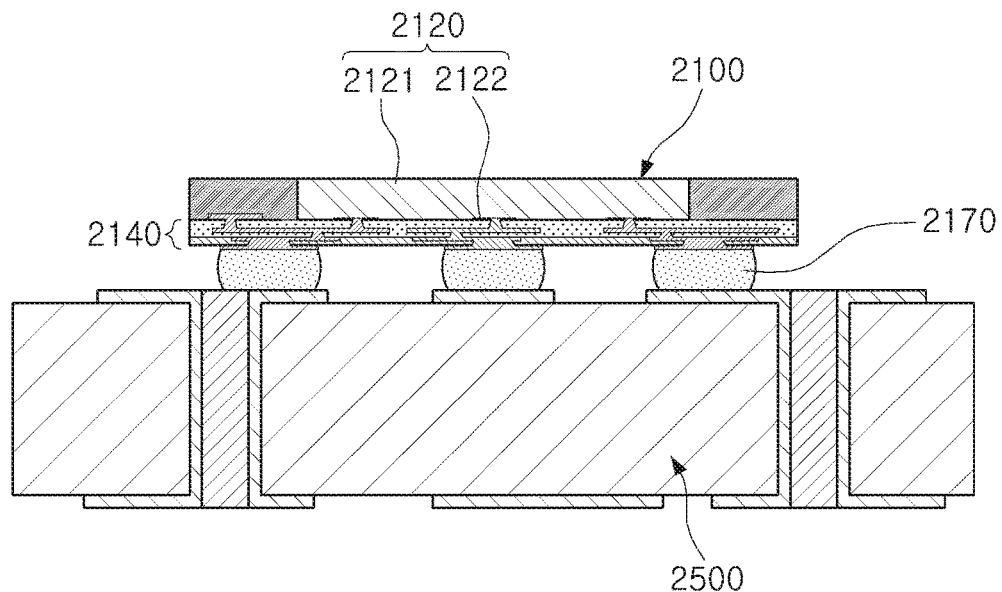
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 up to a fan-out region that is out of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness less than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to a package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package that may improve levels of input impedance in a low frequency domain and a high frequency domain will hereinafter be described with reference to the drawings.

Figure 9:
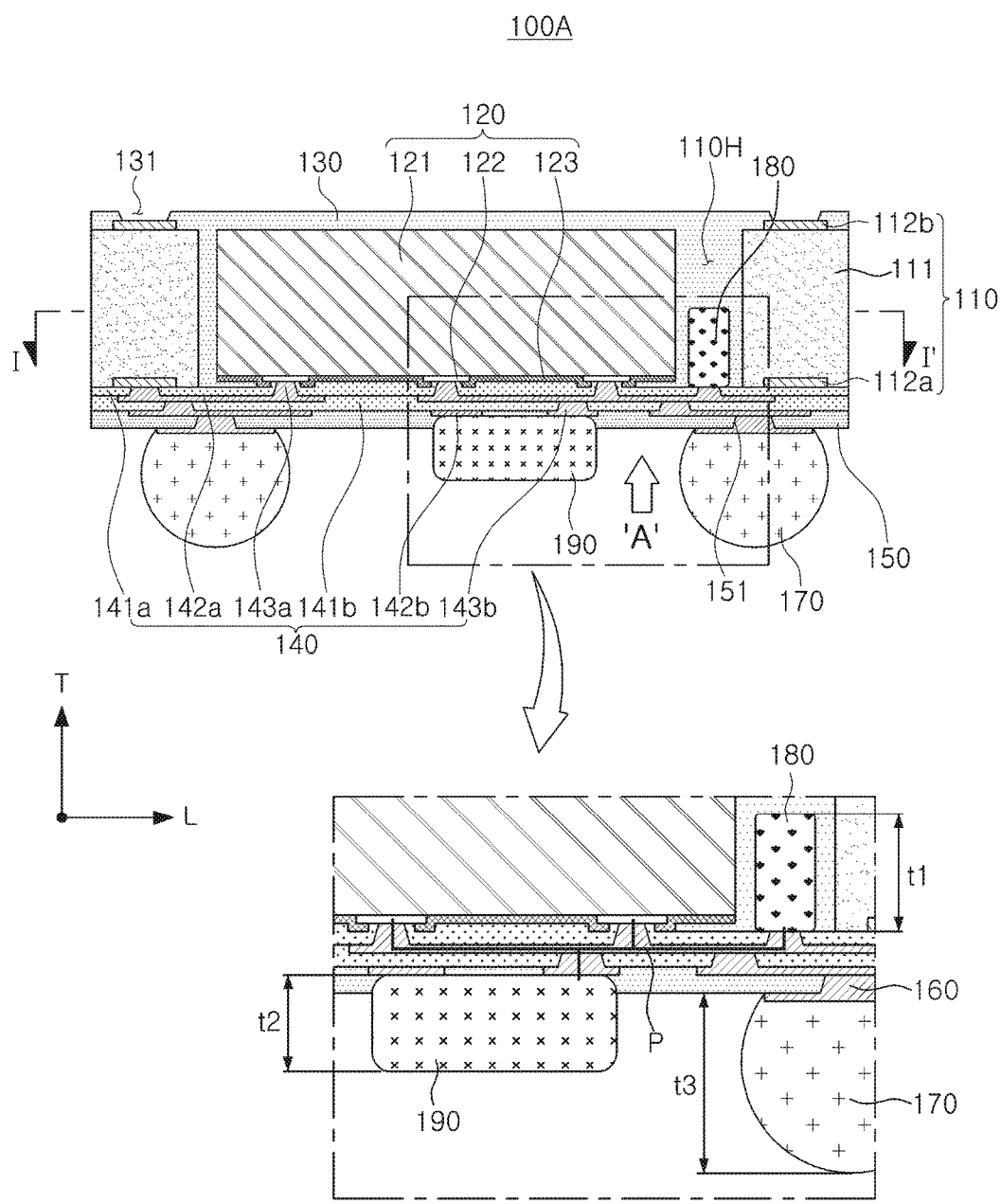
FIG. 9 is a schematic cross-sectional view illustrating an example of a fan-out semiconductor package.

FIG. 9 is a schematic cross-sectional view illustrating an example of a fan-out semiconductor package.

Figure 10:
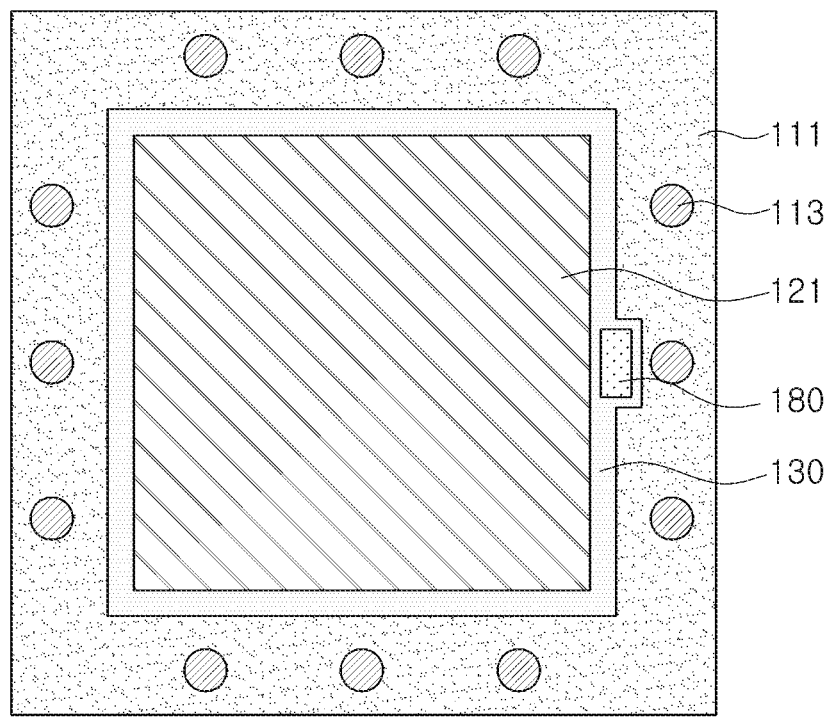
FIG. 10 is a schematic plan view taken along line I-I' of the fan-out semiconductor package of FIG. 9.
Figure 10:
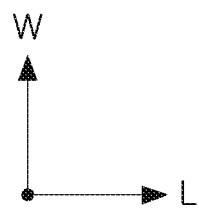

FIG. 10 is a schematic plan view taken along line I-I' of the fan-out semiconductor package of FIG. 9.

Figure 11:
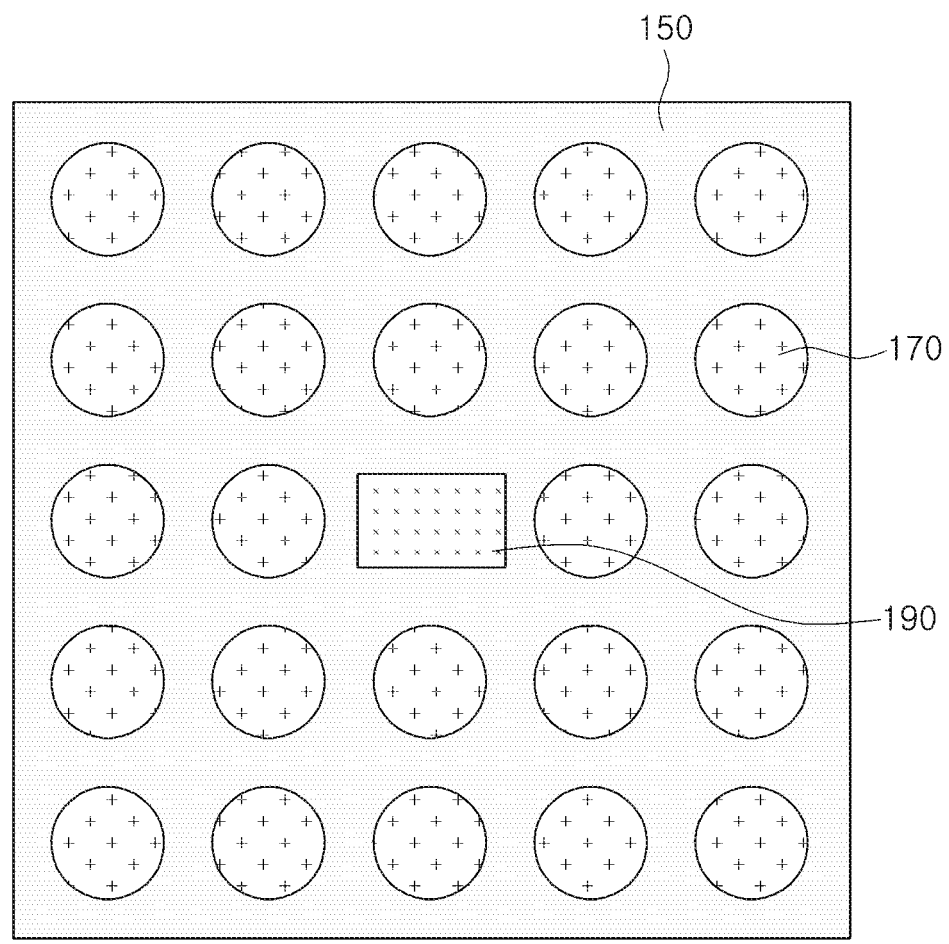
FIG. 11 is a schematic plan view illustrating the fan-out semiconductor package of FIG. 9 when viewed in direction A.
Figure 11:
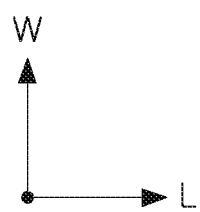

FIG. 11 is a schematic plan view illustrating the fan-out semiconductor package of FIG. 9 when viewed in direction A.

Figure 29:
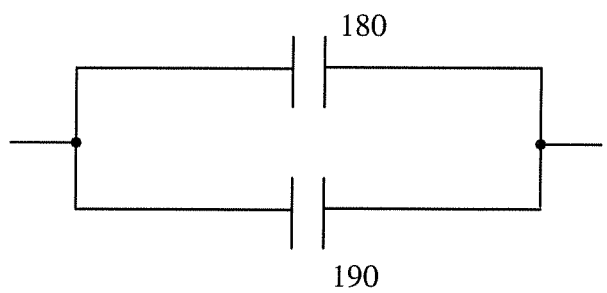
FIG. 29 shows a circuit diagram of first and second capacitors.

Referring to the drawings, a fan-out semiconductor package 100A according to an exemplary embodiment in the present disclosure may include a semiconductor chip 120 having an active surface having connection pads 122 disposed thereon and an inactive surface disposed to oppose the active surface, a first capacitor 180 disposed adjacently to the semiconductor chip 120, an encapsulant 130 encapsulating the first capacitor and at least a portion of the inactive surface of the semiconductor chip 120, a first connection member 140 disposed on the encapsulant 130, the first capacitor, and the active surface of the semiconductor chip 120, and a second capacitor 190 disposed on the other surface of the first connection member 140 opposing one surface of the first connection member 140 on which the semiconductor chip 120 is disposed. The first connection member 140 may include redistribution layers 142a and 142b electrically connected to the connection pads 122 of the semiconductor chip 120, the first capacitor 180, and the second capacitor 190. The first capacitor 180 and the second capacitor 190 may be connected to each other in parallel as shown in FIG. 29, and may be electrically connected to the connection pads 122 of the semiconductor chip 120 through a common power wiring P of the redistribution layers 142a and 142b. Additionally, the fan-out semiconductor package 100A according to the exemplary embodiment may further include a second connection member 110 having a through-hole 110H, a passivation layer 150 disposed on the first connection member 140, an underbump metal layer 160 disposed on the passivation layer 150 and disposed in openings 151 of the passivation layer 150, and connection terminals 170 disposed on the underbump metal layer 160.

In general, a semiconductor package may be mounted on a main board, or the like, using a connection terminal such as a solder ball. Such a connection terminal may be disposed on the other surface of a redistribution layer to be electrically connected to a wiring in the redistribution layer. Meanwhile, since a smooth supply of power has recently been in demand, a disposition of decoupling capacitors on a portion of a region in which the connection terminal may be disposed on the other surface of the redistribution layer is being considered. However, because a space in which the connection terminal may be disposed is limited, when the numbers of such decoupling capacitors for a smooth supply of power, for example, in terms of securing capacitance, increases, the number of connection terminals that may be provided may decrease. Conversely, this may cause a problem in terms of power supply. As another disposition of the decoupling capacitors, the decoupling capacitors may be considered as being disposed to surround an IC on one surface of the redistribution layer. However, in this case, since the decoupling capacitors and the IC have a significant electrical connection path therebetween, side effects may ensue.

Meanwhile, as in the fan-out semiconductor package 100A according to the exemplary embodiment, when the first and second capacitors 180 and 190 may be disposed on the one surface and the other surface of the first connection member 140 including the redistribution layers 142a and 142b, respectively, and may be commonly connected to the power wiring P, a sufficient amount of capacitance may be obtained regardless of the limited space, resulting in enabling a smooth supply of power. In addition, a low equivalent series inductance (ESL) may be implemented. In more detail, in lieu of an increase in the number of second capacitors 190 disposed on the other surface of the first connection member layer 140, the first capacitor 180 disposed on the one surface of the first connection layer 140 may be provided to reduce the space limit. In this case, the first capacitor 180 and the second capacitor 190 may be commonly connected to the power wiring P without simply providing the first capacitor 180 to thus increase a total capacitance of the first and second capacitors 180 and 190 commonly connected to the power wiring P. Resultantly, input impedance in a low frequency domain may be improved. In addition, a total ESL of the first and second capacitors 180 and 190 commonly connected to the power wiring P may be reduced. Resultantly, input impedance in a high frequency domain may be improved.

The respective components included in the fan-out semiconductor package 100A according to the exemplary embodiment will hereinafter be described below in more detail.

The semiconductor chip 120 may be an integrated circuit (IC) provided in an amount of several hundreds to several millions of elements or more integrated in a single chip. The IC may be, for example, an application processor chip such as a central processor (for example, a CPU), a graphics processor (for example, a GPU), a digital signal processor, a cryptographic processor, a microprocessor, a microcontroller, or the like, but is not limited thereto. The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of the connection pads 122 may be a conductive material such as aluminum (Al), or the like. A passivation layer 123 exposing the connection pads 122 may be formed on the body 121, and may be an oxide film formed of SiO, or the like, a nitride film formed of SiN, or the like, or a double layer of an oxide layer and a nitride layer. A lower surface of the connection pads 122 may have a step portion from a lower surface of the encapsulant 130 through the passivation layer 123. Resultantly, a phenomenon in which the encapsulant 130 is bled to the lower surface of the connection pads 122 may be prevented to some degree. An insulating layer (not illustrated), and the like, may also be further disposed at other required positions.

The encapsulant 130 may protect the semiconductor chip 120, the first capacitor 180, the second connection member 110, and the like. An encapsulation form of the encapsulant 130 is not particularly limited, but may be a form in which the encapsulant 130 surrounds at least portions of the semiconductor chip 120, the first capacitor 180, and the second connection member 110, and the like. For example, the encapsulant 130 may cover the first capacitor 180, the second connection member 110, and the inactive surface of the semiconductor chip 120, and fill a space thereamong. In addition, the encapsulant 130 may also fill at least a portion of a space between the passivation layer 123 of the semiconductor chip 120 and the first connection member 140. Meanwhile, the encapsulant 130 may fill the through-hole 110H to thus serve as an adhesive and reduce buckling of the semiconductor chip 120 depending on certain materials.

The certain materials of the encapsulant 130 are not particularly limited. For example, an insulating material may be used as the certain materials of the encapsulant 130. In this case, the insulating material may be a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, a PID resin, or the like. In addition, the known molding material such as an EMC, or the like, may also be used. Alternatively, a resin in which a thermosetting resin or a thermoplastic resin is impregnated together with an inorganic filler in a core material such as a glass cloth (or a glass fabric) may also be used as the insulating material.

The encapsulant 130 may include conductive particles in order to block electromagnetic waves, if necessary. For example, the conductive particles may be any material that may block electromagnetic waves, for example, copper (Cu), aluminum (Al), silver (Ag), tin (Sn), gold (Au), nickel (Ni), lead (Pb), titanium (Ti), a solder, or the like. However, this is only an example, and the conductive particles are not particularly limited thereto.

The first connection member 140 may be configured to redistribute the connection pads 122 of the semiconductor chip 120. Several tens to several hundred connection pads 122 having various functions may be redistributed by the first connection member 140, and may be physically or electrically connected to an external source through connection terminals 170 to be described below depending on the functions. The first connection member 140 may include insulating layers 141a and 141b, the redistribution layers 142a and 142b disposed on insulating layers 141a and 141b, and vias 143a and 143b penetrating through the insulating layers 141a and 141b and connecting the redistribution layers 142a and 142b to each other. In the fan-out semiconductor package 100A according to the exemplary embodiment, the first connection member 140 may include a plurality of layers, but is not limited thereto, and may also include a single layer.

An insulating material may be used as a material of each of the insulating layers 141a and 141b. In this case, a photosensitive insulating material such as a photoimagable dielectric (PID) resin may also be used as the insulating material. In this case, each of the insulating layers 141a and 141b may be formed to have a lower thickness, and a fine pitch of each of the vias 143a and 143b may be achieved more easily. When the insulating layers 141a and 141b are multiple layers, the materials of the insulating layers 141a and 141b may be the same as each other, and may also be different from each other, if necessary. In the case in which the insulating layers 141a and 141b are the multiple layers, the insulating layers 141a and 141b may be integrated with each other depending on processes, so that boundaries therebetween may not be readily apparent.

The redistribution layers 142a and 142b may serve to substantially redistribute the connection pads 122. A material of each of the redistribution layers 142a and 142b may be a conductive material such as copper (Cu), aluminum (Al), silver (Ag), tin (Sn), gold (Au), nickel (Ni), lead (Pb), titanium (Ti), or alloys thereof. The redistribution layers 142a and 142b may perform various functions depending on designs of their corresponding layers. For example, each of the redistribution layers 142a and 142b may include a ground (GND) wiring, a power (PWR) wiring, a signal (S) wiring, or the like. Here, the signal (S) wiring may include various signals except for a GND wiring, a PWR wiring, or the like, for example, data signals, or the like. In addition, each of the redistribution layers 142a and 142b may include a via pad, a connection terminal pad, or the like.

Surface treatment layers (not illustrated) may be further formed on portions of wirings exposed from the redistribution layers 142a and 142b, if necessary. The surface treatment layers (not illustrated) are not particularly limited as long as they are known in the related art, and may be formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The vias 143a and 143b may electrically connect the redistribution layers 142a and 142b, the connection pads 122, or the like, formed on different layers to each other, resulting in an electrical path in the fan-out semiconductor package 100A. A material of each of the vias 143a and 143b may be a conductive material such as copper (Cu), aluminum (Al), silver (Ag), tin (Sn), gold (Au), nickel (Ni), lead (Pb), titanium (Ti), or alloys thereof. Each of the vias 143a and 143b may be completely filled with the conductive material, or the conductive material may also be formed along a wall of each of the vias 143a and 143b. In addition, each of the vias 143a and 143b may have all shapes known in the related art, such as a tapered shape, a cylindrical shape, and the like.

The first capacitor 180 may serve to replenish an amount of capacitance for which the second capacitor 190, to be described below, when used alone, may not be sufficient. The first capacitor 180 may be disposed adjacently to the semiconductor chip 120 on the one surface of the first connection member 140. For example, the first capacitor 180 may be disposed on the same level as the semiconductor chip 120 in a thickness direction T. The first capacitor 180 may be connected to a power wiring P of the first connection member 140 through a power via 143aP of the first connection member 140. The first capacitor 180 may be a multilayer ceramic capacitor (MLCC), and may be an MLCC used as an embedded element in the related art. This may allow the first capacitor 180 to be replenished with a sufficient amount of capacitance.

The second capacitor 190 may serve to provide basic capacitance and implement low ESL. The second capacitor 190 may be surrounded by the connection terminals 170 on the other surface of the first connection member 140 opposing one surface of the first connection member 140 on which the semiconductor chip 120 is disposed. For example, the second capacitor 190 may be disposed on the same level as the connection terminals 170 in the thickness direction T. In this case, the second capacitor 190 may be disposed in such a manner that an electrical connection path between the second capacitor 190 and the semiconductor chip 120 may be significantly reduced. The second capacitor 190 may be directly connected to the power wiring P of the first connection member 140 without a separate via. The second capacitor 190 may be a surface-mount technology (SMT) capacitor as described below, and may thus have a structure in which the second capacitor 190 may have an electrode disposed on a lower surface thereof. This structure may allow the second capacitor 190 to have a small thickness, and an ESL thereof to be significantly reduced.

When levels of capacitance of the first and second capacitors 180 and 190 are defined as $C_1$ and $C_2$, respectively, $C_1$ may be equal to $C_2$. In addition, when thicknesses of the first and second capacitors 180 and 190 are defined as $t_1$ and $t_2$, respectively, $t_1$ may be greater than $t_2$. The second capacitor 190 may be disposed to be surrounded by the connection terminals 170. When the second capacitor 190 is thicker than the connection terminal 170, the fan-out semiconductor package 100A may be difficult to mount on a main board. For example, the thickness of the second capacitor 190 may be limited, and may thus be unlikely to have high capacitance. Meanwhile, the first capacitor 180 may be disposed adjacently to the semiconductor chip 120, and may thus have about the same thickness as that of the semiconductor chip 120. For example, a limit of the thickness of the first capacitor 180 may be less than that of the thickness of the second capacitor 190, and the first capacitor 180 may thus have capacitance higher than that of the second capacitor 190.

When levels of ESL of the first and second capacitors 180 and 190 are defined as $L_1$ and $L_2$, respectively, $L_1$ may be equal to $L_2$. In addition, when levels of equivalent series resistances (ESR) of the first and second capacitors 180 and 190 are defined as $R_1$ and $R_2$, respectively, $R_1$ may be equal to $R_2$. As the second capacitor 190 that may have a significantly reduced electrical connection path from the semiconductor chip 120 has a low ESL and a low ESR, a total ESL and a total ESR of the first and second capacitors commonly connected to the power wiring P may be reduced.

The second connection member 110 may include redistribution layers 112a and 112b redistributing the connection pads 122 of the semiconductor chip 120 to thus reduce the number of layers of the first connection member 140. If necessary, the second connection member 110 may maintain rigidity of the fan-out semiconductor package 100A depending on certain materials, and serve to secure uniformity of a thickness of the encapsulant 130. In some cases, due to the second connection member 110, the fan-out semiconductor package 100A according to the exemplary embodiment may be used as a portion of a package-on-package. The second connection member 110 may have the through-hole 110H. The through-hole 110H may have the semiconductor chip 120 and the first capacitor 180 disposed therein to be spaced apart from the second connection member 110. For example, side surfaces of the semiconductor chip 120 and the first capacitor 180 may be surrounded by the second connection member 110. The first capacitor 180 may be disposed in a recess formed in the through-hole 110H of the second connection member 110. However, such a disposition form is only an example and may be variously modified into other forms, and the fan-out semiconductor package 100A may perform another function depending on such a form.

The second connection member 110 may include an insulating layer 111 contacting the first connection member 140, a first redistribution layer 112a contacting the first connection member 120 and embedded in the insulating layer 111, and a second redistribution layer 112b disposed on the other surface of the insulating layer 111 opposing one surface of the insulating layer 111 in which the first redistribution layer 112a is embedded. The second connection member 110 may include vias 113 penetrating through the insulating layer 111 and electrically connecting the first and second redistribution layers 112a and 112b to each other. The first and second redistribution layers 112a and 112b may be electrically connected to the connection pads 122. When the first redistribution layer 112a is embedded in the insulating layer 111, a step portion generated due to a thickness of the first redistribution layer 112a may be significantly reduced, and an insulating distance of the first connection member 140 may thus become constant. That is, a difference between a distance from the redistribution layers 142a and 142b of the first connection member 140 to a lower surface of the insulating layer 111 and a distance from the redistribution layers 142a and 142b of the first connection member 140 to the connection pads 122 may be less than a thickness of the first redistribution layer 112a. Therefore, a high density wiring design of the first connection member 140 may be easily implemented.

A material of the insulating layer 111 is not particularly limited. For example, an insulating material may be used as a material of the insulating layer 111. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass cloth (or a glass fabric), for example, prepreg, Ajinomoto Build up Film (ABF), FR-4, Bismaleimide Triazine (BT), or the like. Alternatively, a photoimagable dielectric (PID) resin may also be used as the insulating material.

The redistribution layers 112a and 112b may serve to redistribute the connection pads 122 of the semiconductor chip 120. A material of each of the redistribution layers 112a and 112b may be a conductive material such as copper (Cu), aluminum (Al), silver (Ag), tin (Sn), gold (Au), nickel (Ni), lead (Pb), titanium (Ti), or alloys thereof. The redistribution layers 112a and 112b may perform various functions depending on designs of their corresponding layers. For example, each of the redistribution layers 112a and 112b may include a ground (GND) wiring, a power (PWR) wiring, a signal (S) wiring, or the like. In addition, each of the redistribution layers 112a and 112b may include a via pad, a connection terminal pad, or the like. As a nonrestrictive example, most of the redistribution layers 112a and 112b may be formed of ground wirings. In this case, the number of ground wirings formed on the redistribution layers 142a and 142b of the first connection member 140 may be significantly reduced, such that a degree of wiring design freedom may be improved.

Surface treatment layers (not illustrated) may be further formed on portions of wirings exposed from the redistribution layers 112a and 112b through openings 131 formed in the encapsulant 130, if necessary. The surface treatment layers (not illustrated) are not particularly limited as long as they are known in the related art, and may be formed by, for example, electrolytic gold plating, electroless gold plating, organic solderability preservative (OSP) or electroless tin plating, electroless silver plating, electroless nickel plating/ substituted gold plating, direct immersion gold (DIG) plating, hot air solder leveling (HASL), or the like.

The vias 113 may electrically connect the redistribution layers 112a and 112b formed on different layers to each other, resulting in an electrical path in the second connection member 110. Each of the vias 113 may also be formed of a conductive material. Each of the vias 113 may be completely filled with the conductive material, as illustrated in FIG. 10, or the conductive material may also be formed along a wall of each of the vias 113. In addition, each of the vias 113 may have all of the shapes known in the related art, such as a tapered shape, a cylindrical shape, and the like.

Thicknesses of the redistribution layers 112a and 112b of the second connection member 110 may be greater than those of the redistribution layers 142a and 142b of the first connection member 140. Since the second connection member 110 may have a thickness equal to or greater than that of the semiconductor chip 120, the redistribution layers 112a and 112b formed in the second connection member 110 may be formed at large sizes depending on a scale of the second connection member 110. On the other hand, the redistribution layers 142a and 142b of the first connection member 140 may be formed at sizes relatively smaller than those of the redistribution layers 112a and 112b of the second connection member 110 for thinness of the first connection member 140.

The inactive surface of the semiconductor chip 120 may be disposed on a level below an upper surface of the second redistribution layer 112b of the second connection member 110. For example, the inactive surface of the semiconductor chip 120 may be disposed on a level below an upper surface of the insulating layer 111 of the second connection member 110. A height difference between the inactive surface of the semiconductor chip 120 and the upper surface of the second redistribution layer 112b of the second connection member 110 may be 2 μm or more, for example, 5 μm or more. In this case, generation of cracks in corners of the inactive surface of the semiconductor chip 120 may be effectively prevented. In addition, a deviation of an insulating distance on the inactive surface of the semiconductor chip 120 in a case in which the encapsulant 130 is used may be significantly reduced.

The passivation layer 150 may be configured to protect the first connection member 140 from external physical or chemical damage. The passivation layer 150 may have the openings 151 exposing at least portions of wirings of the redistribution layers 142a and 142b of the first connection member 140. Each of the openings 151 may expose the entirety or only a portion of a surface of each of the redistribution layers 142a and 142b. In some cases, each of the openings 151 may expose a side surface of each of the redistribution layers 142a and 142b.

A material of the passivation layer 150 is not particularly limited, and may be, for example, a photosensitive insulating material. Alternatively, a solder resist may also be used as the material of the passivation layer 150. Alternatively, an insulating resin that does not include a core material, but includes a filler, for example, an ABF including an inorganic filler and an epoxy resin, or the like, may be used as the material of the passivation layer 150. A surface roughness of the passivation layer 150 may be lower as compared to a general case. When the surface roughness is low as described above, several side effects that may ensue in a circuit forming process, for example, generation of a stain on a surface, difficulty in implementing a fine circuit, and the like, may be improved.

The underbump metal layer 160 may be additionally configured to improve connection reliability of the connection terminals 170 to improve board level reliability. The underbump metal layer 160 may fill at least portions of the openings 151 of the passivation layer 150. The underbump metal layer 160 may be formed by the known metallization method. The underbump metal layer 160 may include the known metal. The underbump metal layer 160 may be formed by forming a seed layer by electro copper plating and forming a plating layer on the seed layer by electroless copper plating.

The connection terminals 170 may be additionally configured to physically or electrically externally connect the fan-out semiconductor package 100A. For example, the fan-out semiconductor package 100A may be mounted on the main board of the electronic device through the connection terminals 170. Each of the connection terminals 170 may be formed of a conductive material, for example, a solder, or the like. However, this is only an example, and a material of each of the connection terminals 170 is not particularly limited thereto. Each of the connection terminals 170 may be a land, a ball, a pin, or the like. The connection terminals 170 may be formed as multiple layer structures or a single layer structures. When the connection terminals 170 are formed as multiple layer structures, the connection terminals 170 may include a copper pillar and a solder. When the connection terminals 170 are formed as single layer structures, the connection terminals 170 may include a tin-silver solder or copper. However, this is only an example, and the connection terminals 170 are not limited thereto. The number, an interval, a disposition, or the like, of the connection terminals 170 is not particularly limited, and may be sufficiently modified by a person skilled in the art depending on design particulars. For example, the connection terminals 170 may be provided in an amount of several tens to several thousands according to the number of connection pads 122 of the semiconductor chip 120, but are not limited thereto, and may also be provided in an amount of tens of thousands of or more.

At least one of the connection terminals 170 may be disposed in a fan-out region. The fan-out region is a region except for the region in which the semiconductor chip 120 is disposed. For example, the fan-out semiconductor package 100A according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a small thickness, and may have price competitiveness.

Although not illustrated in the drawings, a metal layer may be further disposed on an inner wall of the through-hole 110 of the second connection member 110, if necessary. That is, side surfaces of the semiconductor chip 120 may also be surrounded by the metal layer. Heat generated by the semiconductor chip 120 may be effectively radiated in an upward or downward direction of the fan-out package 100A through the metal layer, and electromagnetic waves may be effectively blocked from passing through the metal layer. In addition, if necessary, a plurality of semiconductor chips may be disposed in the through-hole 110H of the second connection member 110, and the number of through-holes 110H of the second connection member 110 may be plural and semiconductor chips may be disposed in the respective through-holes.

Figure 12:
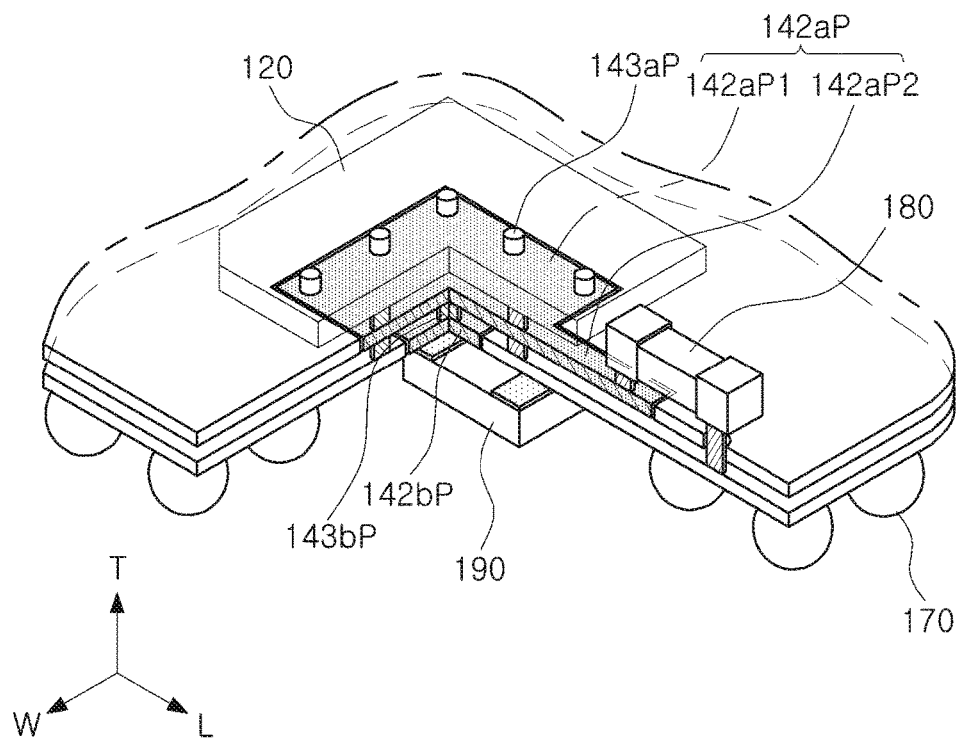
FIG. 12 is a schematic perspective view illustrating an example in which a semiconductor chip, a first capacitor, a second capacitor, and power wirings of a fan-out semiconductor package are connected to one another.

FIG. 12 is a schematic perspective view illustrating an example in which a semiconductor chip, a first capacitor, a second capacitor, and power wirings of a fan-out semiconductor package are connected to one another.

Figure 13:
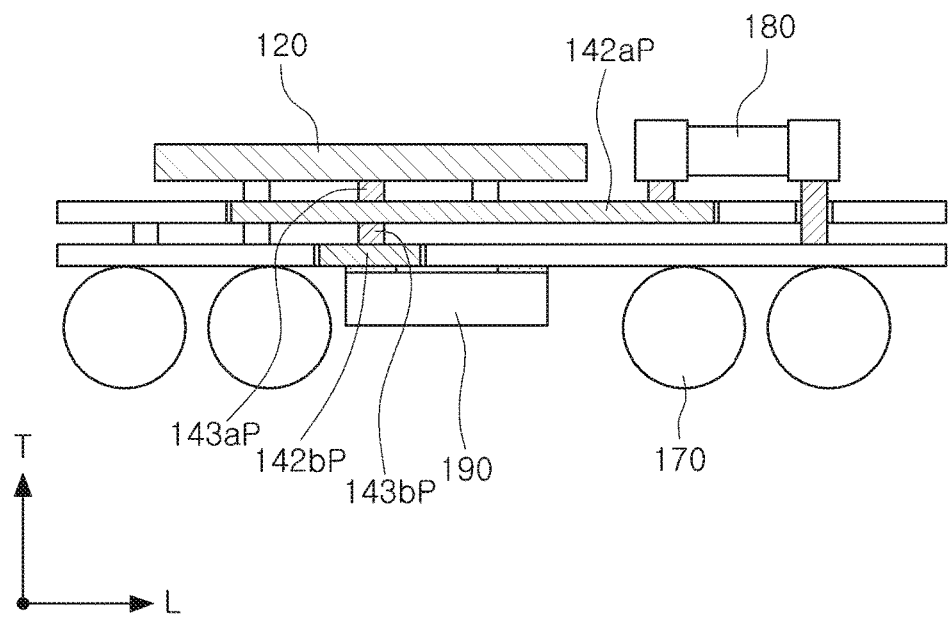
FIG. 13 is a schematic cross-sectional view illustrating an example in which a semiconductor chip, a first capacitor, a second capacitor, and power wirings of a fan-out semiconductor package are connected to one another.

FIG. 13 is a schematic cross-sectional view illustrating an example in which a semiconductor chip, a first capacitor, a second capacitor, and power wirings of a fan-out semiconductor package are connected to one another.

Referring to the drawings, first and second capacitors 180 and 190 may be commonly connected to a power plane of the redistribution layers 142a and 142b in the first connection member 140. The power plane may be provided in a large number unlike the example illustrated in the drawings. For example, various types of power electrode pads may be present in the electrode pads 122 of the semiconductor chip 120, and various types of power planes connected to the power electrode pads through power vias may be present. All of the first and second capacitors 180 and 190 may be connected to any common power plane 142aP1 of the power planes, for example, a common power plane for a central processing unit (CPU).

As a nonrestrictive example, any power connection pad of the semiconductor chip 120 may be connected to the power plane 142aP1 described above through a power via 143aP, and the first capacitor 180 may be connected to a power line 142aP2 connected to the power plane 142aP1 described above through another power via to be ultimately connected to the power plane 142aP1 described above. The power plane 142aP1 and the power line 142aP2 may constitute a certain power wiring 142aP of a corresponding layer. The second capacitor 190 may be directly connected to any certain power wiring 142bP of another layer, and the power wirings 142aP and 142bP of different layers may be connected to each other by a power via 143bP to constitute any certain power wiring P.

FIGS. 14A, 14B, 14C, and 14D are schematic perspective views illustrating an example in which a semiconductor chip, a first capacitor, a second capacitor, and power wirings of a fan-out semiconductor package are connected to one another in each layer.

Figure 14A:
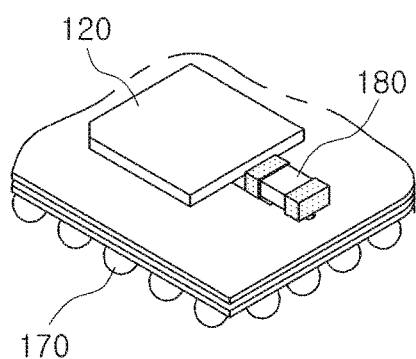
FIGS. 14A, 14B, 14C, and 14D are schematic perspective views illustrating an example in which a semiconductor chip, a first capacitor, a second capacitor, and power wirings of a fan-out semiconductor package are connected to one another in each layer.
Figure 14B:
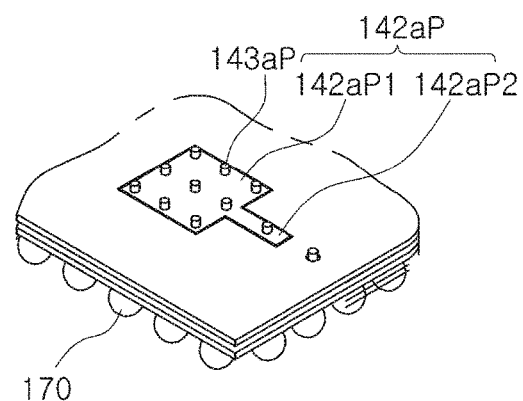
Figure 14C:
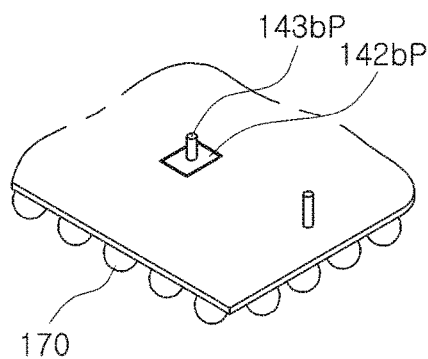
Figure 14D:
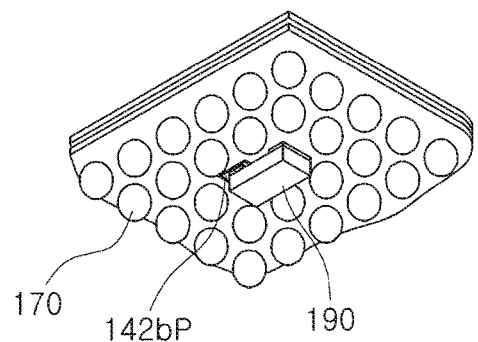

Referring to the drawings, the first capacitor 180 may be connected to any power wiring 142aP of a corresponding layer through a power via 143aP to be ultimately electrically connected to certain power connection pads of the semiconductor chip 120. In addition, the second capacitor 190 may be directly connected to any power wiring 142bP of another layer to be ultimately electrically connected to certain power connection pads of the semiconductor chip 120 electrically connected to the first capacitor 180. In the drawings, FIGS. 14A through 14C are top perspective views, and FIG. 14D is a bottom perspective view.

FIGS. 15A and 15B are schematic perspective views illustrating an example of a first capacitor.

Referring to the drawings, the first capacitor 180 may be a general embedded MLCC having a length greater than a width. In more detail, the first capacitor 180 may include a body 181, a first external electrode 182a, and a second external electrode 182b. The body 181 may include dielectric layers 183, and first internal electrodes 184a and second internal electrodes 184b alternately disposed with the dielectric layers 183 disposed therebetween, may have a thickness less than a width and a length, and the width thereof may be less than the length. The first and second external electrodes 182a and 182b may surround both ends of the body 181 in a length direction of the body 181, and may be respectively connected to the first and second internal electrodes 184a and 184b alternately led out to both ends of the body 181. In this case, referring to the drawings, the first external electrode 182a or the second external electrode 182b may be connected to the power wiring 142aP and the power wiring 142bP through the power vias 143aP in the first connection member 140. Such an embedded MLCC may be replenished with a sufficient amount of capacitance, and may have price competitiveness. In the drawings, FIG. 15A is a perspective view illustrating the appearance of a first capacitor according to an example, and FIG. 15B is an exploded perspective view illustrating the interior of a first capacitor according to an example.

Each of the dielectric layers 183 may include a ceramic powder having a high dielectric constant. In this case, the ceramic powder may be, for example, a barium titanate (BT)-based powder, a barium strontium titanate (BST)-based powder, or the like, but is not limited thereto, and may also be another well-known ceramic powder. Each of the first and second internal electrodes 184a and 184b may be formed by printing a paste having a certain thickness and including a conductive metal on each of the dielectric layers 183, and may be electrically insulated from each other by the dielectric layers 183 disposed between the first and second internal electrodes 184a and 184b. The conductive metal may be nickel (Ni), copper (Cu), palladium (Pd), or alloys thereof, but is not limited thereto. Each of the first and second external electrodes 182a and 182b may include an electrode layer and a resin layer. The electrode layer may include a conductive material, for example, gold (Au), silver (Ag), copper (Cu), platinum (Pt), aluminum (Al), nickel (Ni), or the like. The resin layer may include a conductive resin, for example, a metal powder and a base resin. The metal powder may include copper (Cu), silver (Ag), or the like, but is not limited thereto. The base resin may be a thermosetting resin, for example, an epoxy resin, but is not limited thereto.

Figure 16B:
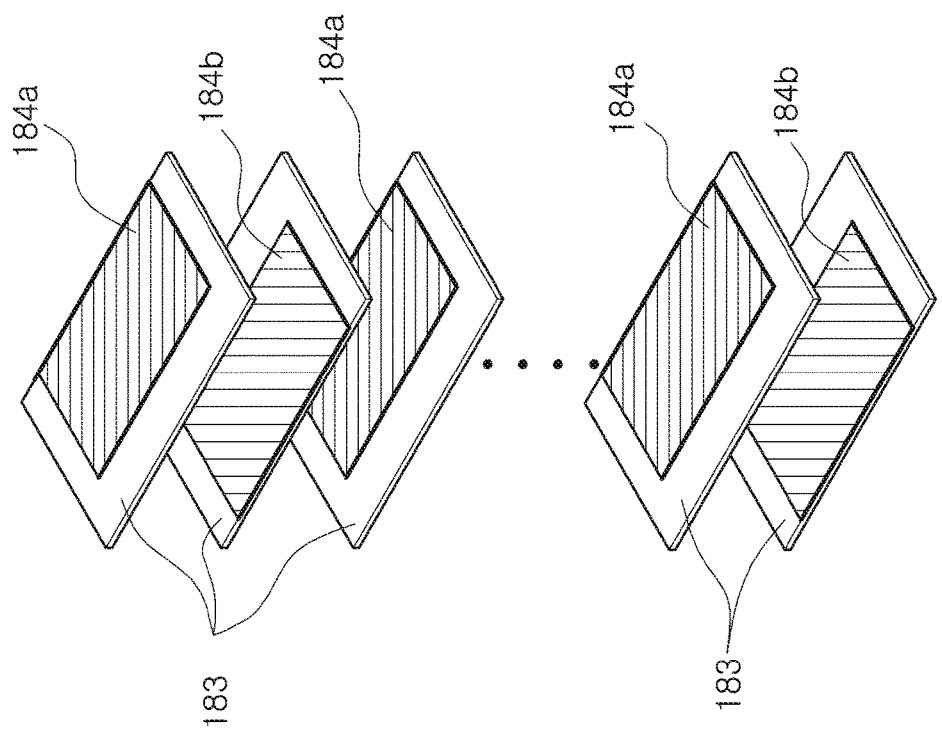
FIGS. 16A and 16B are schematic perspective views illustrating another example of a first capacitor.
Figure 16A:
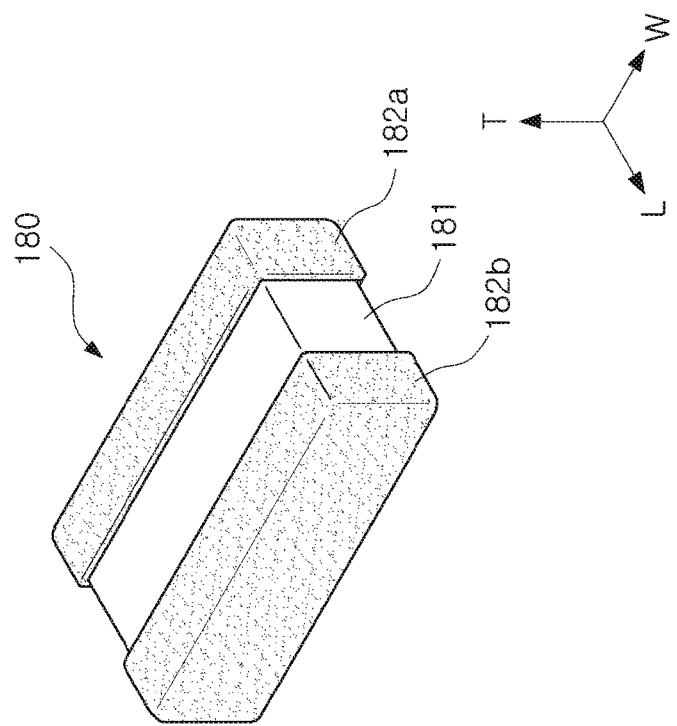

FIGS. 16A and 16B are schematic perspective views illustrating another example of a first capacitor.

Referring to the drawings, a first capacitor 180 may be an embedded MLCC having a width greater than a length. In more detail, the first capacitor 180 may include a body 181, a first external electrode 182a, and a second external electrode 182b. The body 181 may include dielectric layers 183, and first internal electrodes 184a and second internal electrodes 184b alternately disposed with the dielectric layers 183 disposed therebetween, may have a thickness less than a width and a length, and the width thereof may be greater than the length. The first and second external electrodes 182a and 182b may surround both ends of the body 181 in a length direction of the body 181, and may be respectively connected to the first and second internal electrodes 184a and 184b alternately led out to both ends of the body 181. In this case, referring to the drawings, the first external electrode 182a or the second external electrode 182b may be connected to the power wiring 142aP and the power wiring 142bP through the power vias 143aP in the first connection member 140. Such an embedded multilayer ceramic capacitor may be replenished with a sufficient amount of capacitance, and may have low equivalent series impedance. A detailed material, or the like, of each of the components is the same as that described above, and is thus omitted. In the drawings, FIG. 16A is a perspective view illustrating the appearance of a first capacitor according to another example, and FIG. 15B is an exploded perspective view illustrating the interior of a first capacitor according to another example.

Figure 17A:
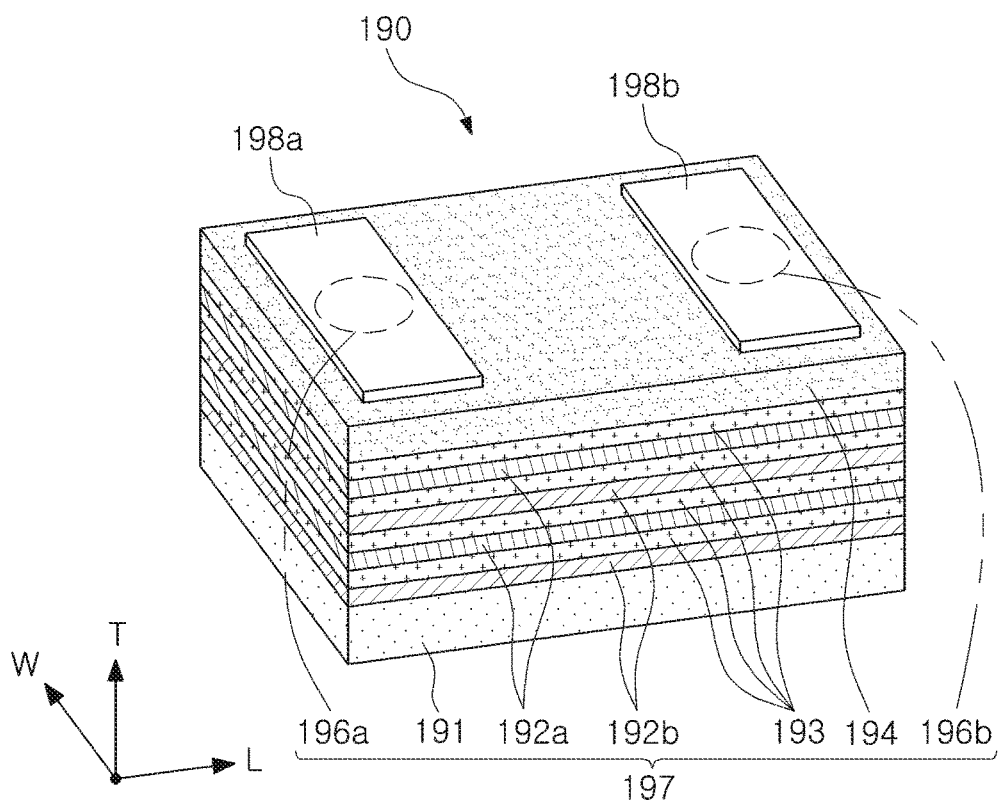
FIGS. 17A and 17B are a schematic perspective views and a cross-sectional view illustrating an example of a second capacitor.
Figure 17B:
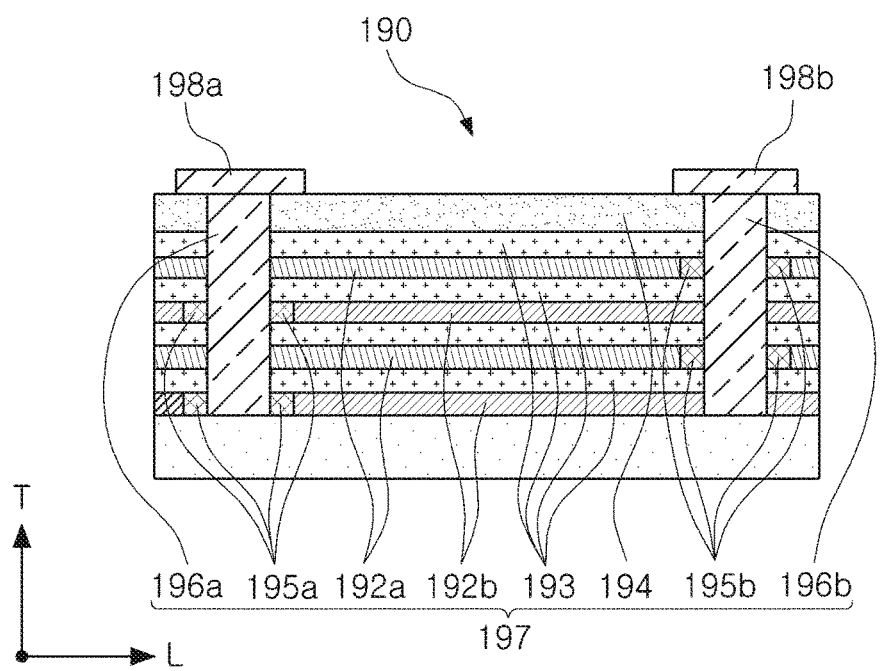

FIGS. 17A and 17B are a schematic perspective view and a cross-sectional view illustrating an example of a second capacitor.

Referring to the drawings, a second capacitor 190 may be an SMT capacitor, and may thus have a structure in which the second capacitor 190 may have an electrode formed on a lower surface thereof. In more detail, the second capacitor 190 may include a body 197, a first external electrode 198a, and a second external electrode 198b. The body 197 may include dielectric layers 193, first internal electrodes 192a and second internal electrodes 192b alternately disposed with the dielectric layers 193 disposed therebetween, a first via electrode 196a and a second via electrode 196b penetrating through the dielectric layers 193, selectively connected to the first internal electrodes 192a and the second internal electrodes 192b, and may have a thickness less than a width and a length. The first and second external electrodes 198a and 198b may be spaced apart from each other on a surface of the body 197 in a width direction of the body 197, and may be respectively connected to the first and second via electrodes 196a and 196b led out to the surface. In this case, referring to the drawings, the first or second external electrode 198a or 198b may be directly connected to the power wiring P. Alternatively, the first or second external electrode 198a or 198b may be connected to the power wiring P through soldering, or the like. The first and second via electrodes 196a and 196b may be spaced apart from each other in the length direction of the body 197. Similarly, the first and second external electrodes 198a and 198b may be spaced apart from each other in the length direction of the body 197. Such an SMT capacitor may be formed by a method of sequentially laminating components on a wafer, for example, a silicon (Si) board. Thus, a one-time process may enable a plurality of capacitors to be manufactured, thus obtaining excellent price competitiveness, enabling a compact size, and significantly reducing ESL. In the drawings, FIG. 17A is a perspective view illustrating the appearance of a second capacitor according to an example, and FIG. 17B is an exploded cross-sectional view illustrating the interior of a second capacitor according to an example.

The first and second internal electrodes 192a and 192b may be metal layers including metals different from each other. For example, the first and second internal electrodes 192a and 192b may be copper (Cu), gold (Au), aluminum (Al), chromium (Cr), nickel (Ni), titanium (Ti), tungsten (W), or alloys thereof, and may include metals different from each other. This is for selectively connecting the first and second internal electrodes 192a and 192b to the first and second via electrodes 196a and 196b, respectively, using selective etching, or the like, in a manufacturing process. Only if the first and second internal electrodes 192a and 192b may be formed in a form different from that illustrated in the drawings, and may be selectively connected to the first and second via electrodes 196a and 196b, respectively, the first and second internal electrodes 192a and 192b may include an identical material.

The first and second via electrodes 196a and 196b may be selectively connected to the first and second internal electrodes 192a and 192b, respectively, to selectively connect the first and second internal electrodes 192a and 192b to the first and second external electrodes 198a and 198b, respectively. The first via electrode 196a may be connected to the first internal electrodes 192a, and may be insulated from the second internal electrodes 192b. An insulating method may use first insulating layers 195a as illustrated in the drawings, but is not limited thereto, and may use a method of disposing the second internal electrodes 192b so as not to be connected to the first via electrode 196a. The second via electrode 196b may be connected to the second internal electrodes 192b, and may be insulated from the first internal electrodes 192a. An insulating method may use second insulating layers 195b as illustrated in the drawings, but is not limited thereto, and may use a method of disposing the first internal electrodes 192a so as not to be connected to the second via electrode 196b. Each of the first and second via electrodes 196a and 196b may include a common conductive material. The first and second via electrodes 196a and 196b may be provided in plural. This may allow control of various features.

Each of the dielectric layers 193 may include a ceramic powder having a high dielectric constant. In this case, the ceramic powder may be, for example, a barium titanate (BT)-based powder, a barium strontium titanate (BST)-based powder, or the like, but is not limited thereto, and may also be another well-known ceramic powder. The body 197 may further include an insulating layer 194 formed on one surface thereof to form the first and second external electrodes 198a and 198b. In addition, the body 197 may further include a board 191 formed on the other surface of the body 197 to support the remainder of the components of the body 197 except for the insulating layer 194. The insulating layer 194 may include a common insulating material. A material of the board 191 is not particularly limited, and may be, for example, a silicon (Si) wafer.

Each of the first and second external electrodes 198a and 198b may include an electrode layer and a resin layer. The electrode layer may include a conductive material, for example, gold (Au), silver (Ag), copper (Cu), platinum (Pt), aluminum (Al), nickel (Ni), or the like. The resin layer may include a conductive resin, for example, a metal powder and a base resin. The metal powder may include copper (Cu), silver (Ag), or the like, but is not limited thereto. The base resin may be a thermosetting resin, for example, an epoxy resin, but is not limited thereto.

Figure 18A:
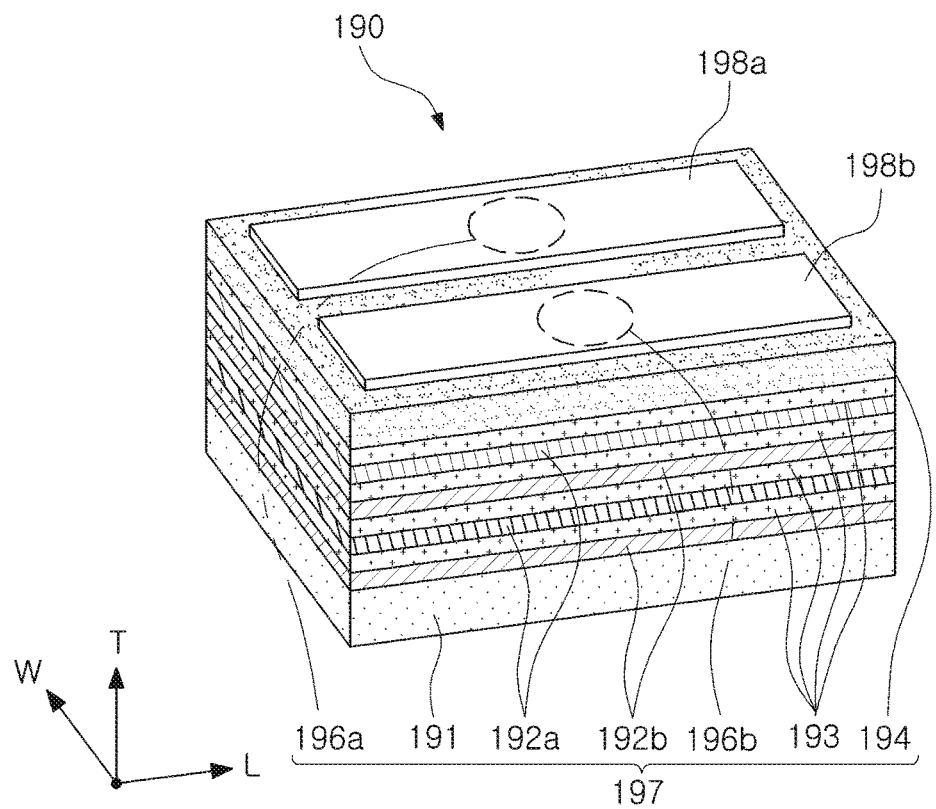
FIGS. 18A and 18B are a schematic perspective view and a cross-sectional view illustrating another example of a second capacitor.
Figure 18B:
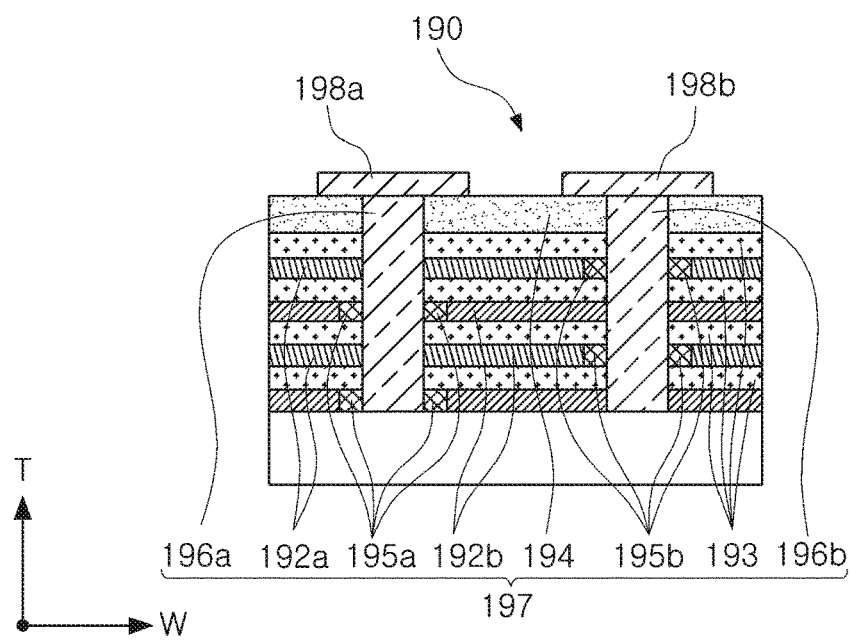

FIGS. 18A and 18B are a schematic perspective view and a cross-sectional view illustrating another example of a second capacitor.

Referring to the drawings, a second capacitor 190 may be an SMT capacitor, and may thus have a structure in which the second capacitor 190 may have an electrode formed on a lower surface thereof. In more detail, the second capacitor 190 may include a body 197, a first external electrode 198a, and a second external electrode 198b. The body 197 may include dielectric layers 193, first internal electrodes 192a and second internal electrodes 192b alternately disposed with the dielectric layers 193 disposed therebetween, a first via electrode 196a and a second via electrode 196b penetrating through the dielectric layers 193, selectively connected to the first internal electrodes 192a and the second internal electrodes 192b, and may have a thickness less than a width and a length. The first and second external electrodes 198a and 198b may be spaced apart from each other on a surface of the body 197 in a width direction of the body 197, and may be respectively connected to the first and second via electrodes 196a and 196b led out to the surface. In this case, referring to the drawings, the first or second external electrode 198a or 198b may be directly connected to the power wiring P. Alternatively, the first or second external electrode 198a or 198b may be connected to the power wiring P through soldering, or the like. The first and second via electrodes 196a and 196b may be spaced apart from each other in the width direction of the body 197. Similarly, the first and second external electrodes 198a and 198b may be spaced apart from each other in the width direction of the body 197. For example, dispositions of the first and second via electrodes 196a and 196b and the first and second external electrodes 198a and 198b may be changed. A detailed material, or the like, of each of the components is the same as that described above, and is thus omitted. In the drawings, FIG. 18A is a perspective view illustrating the appearance of a second capacitor according to another example, and FIG. 18B is a cross-sectional view illustrating the interior of a second capacitor according to another example.

Figure 19:
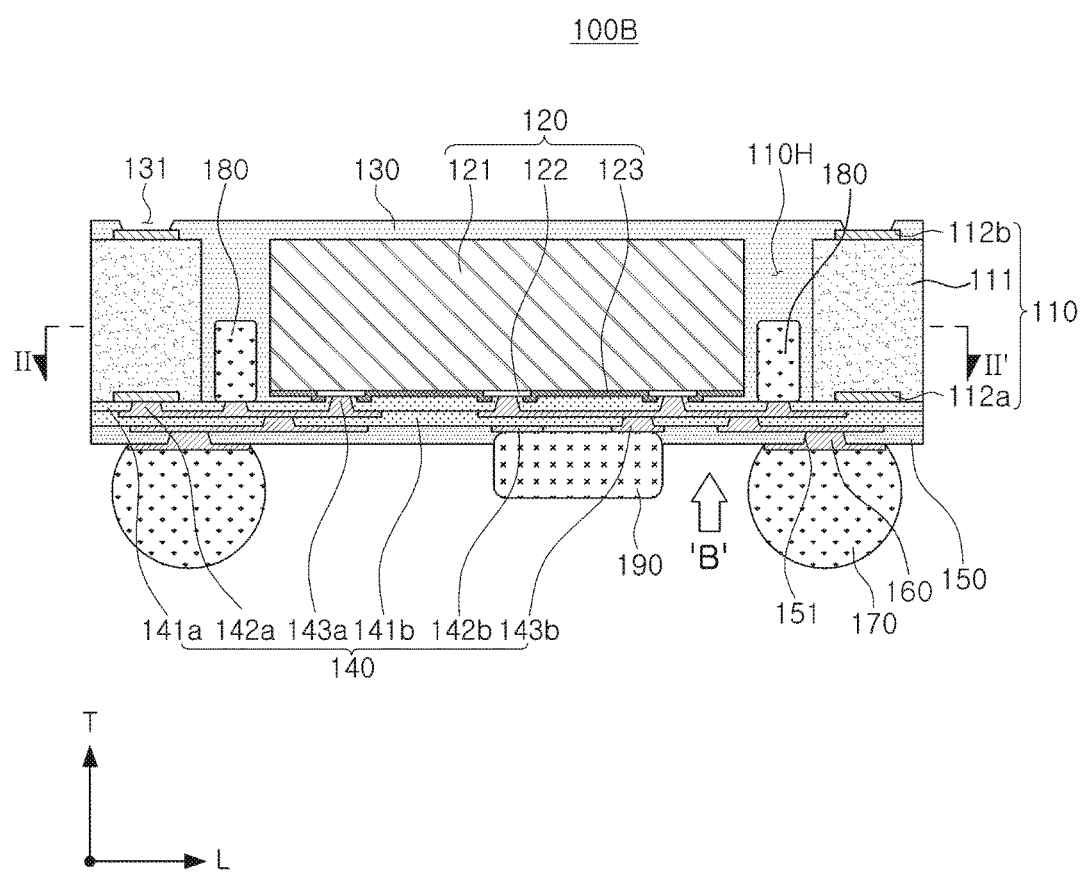
FIG. 19 is a schematic cross-sectional view illustrating another example of a fan-out semiconductor package.

FIG. 19 is a schematic cross-sectional view illustrating another example of a fan-out semiconductor package.

Figure 20:
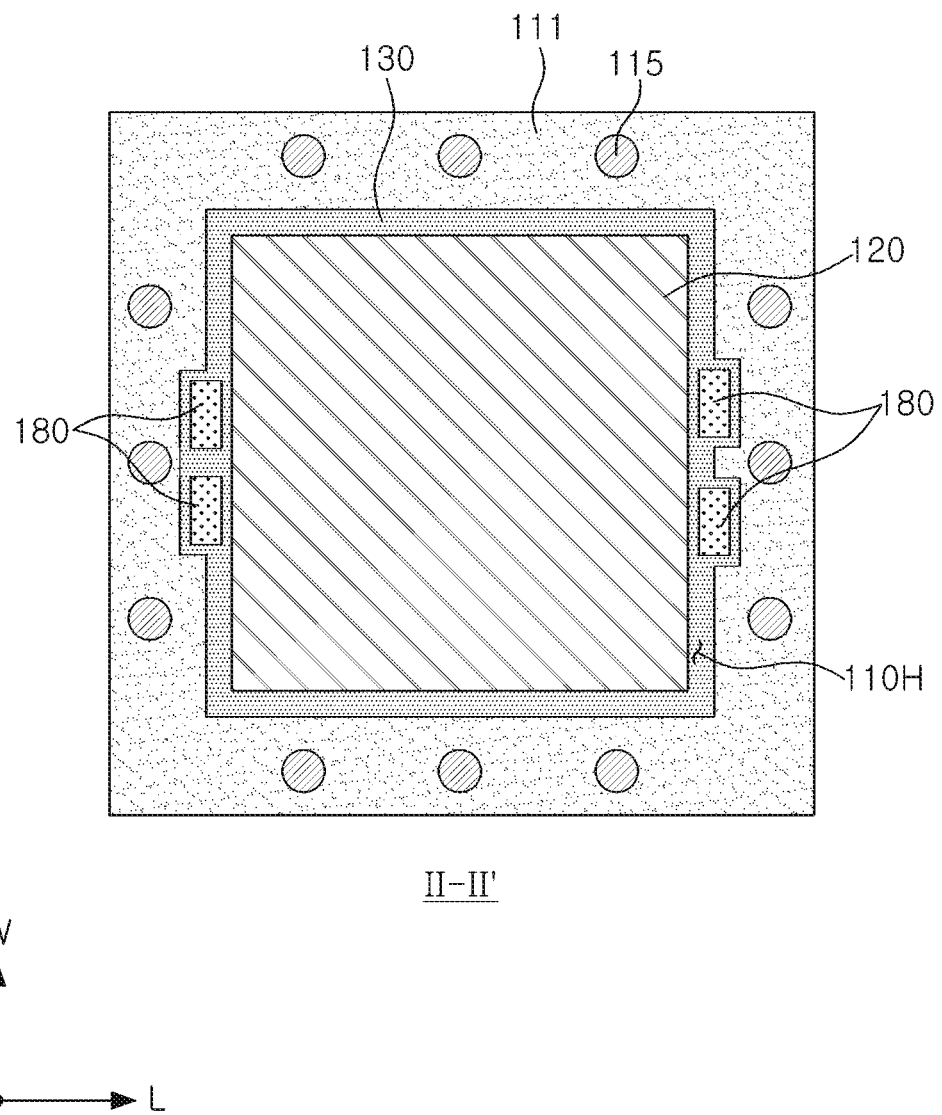
FIG. 20 is a schematic plan view taken along line II-II' of the fan-out semiconductor package of FIG. 19.

FIG. 20 is a schematic plan view taken along line II-II' of the fan-out semiconductor package of FIG. 19.

Figure 21:
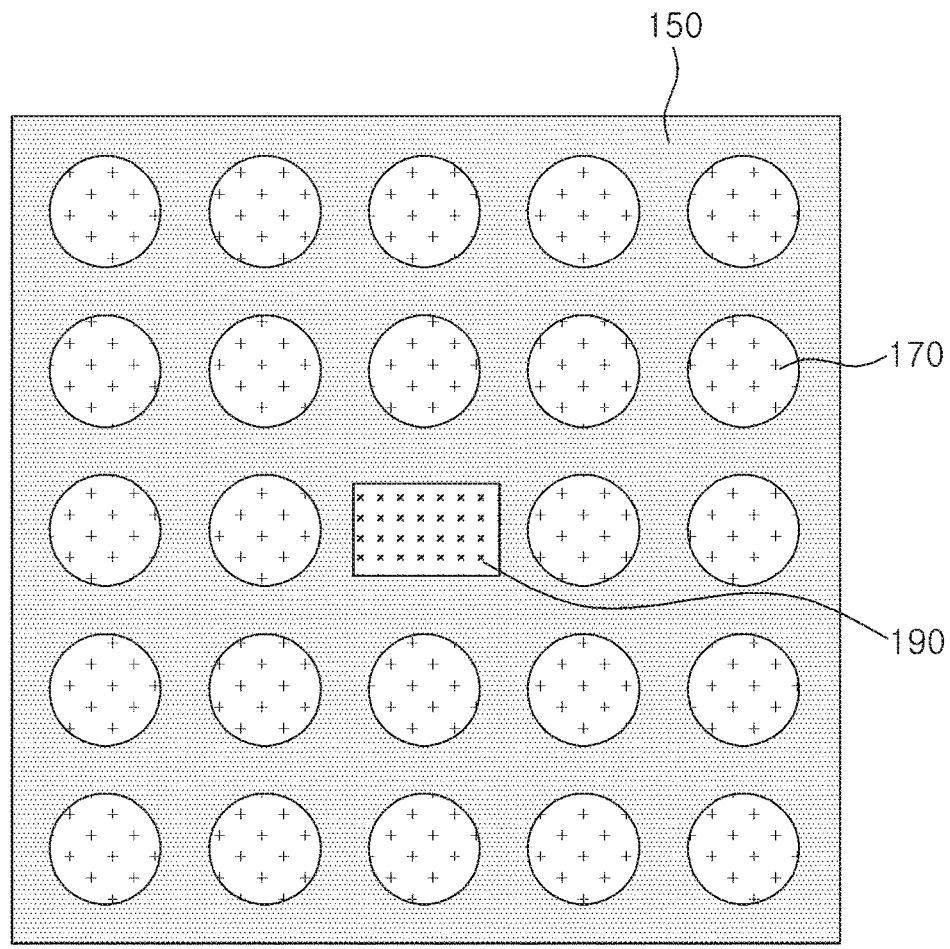
FIG. 21 is a schematic plan view illustrating the fan-out semiconductor package of FIG. 20 when viewed in direction B.

FIG. 21 is a schematic plan view illustrating the fan-out semiconductor package of FIG. 20 when viewed in direction B.

Referring to the drawings, a fan-out semiconductor package 100B may include a plurality of first capacitors 180. All of the plurality of first capacitors 180 along with a second capacitor 190 may be commonly connected to a power wiring. In this case, the fan-out semiconductor package 100B may be further beneficial to ensuring capacity, resulting in improving impedance more effectively. All of the plurality of first capacitors 180 may be disposed to surround a semiconductor chip 120 on one surface of the first connection member 140. The plurality of first capacitors 180 may be disposed in a plurality of recesses formed in a through-hole 110H. In some cases, at least two first capacitors 180 may also be disposed in a single recess. A description, or the like, of other configurations except for the abovementioned configuration overlaps that described above, and is thus omitted.

Figure 22:
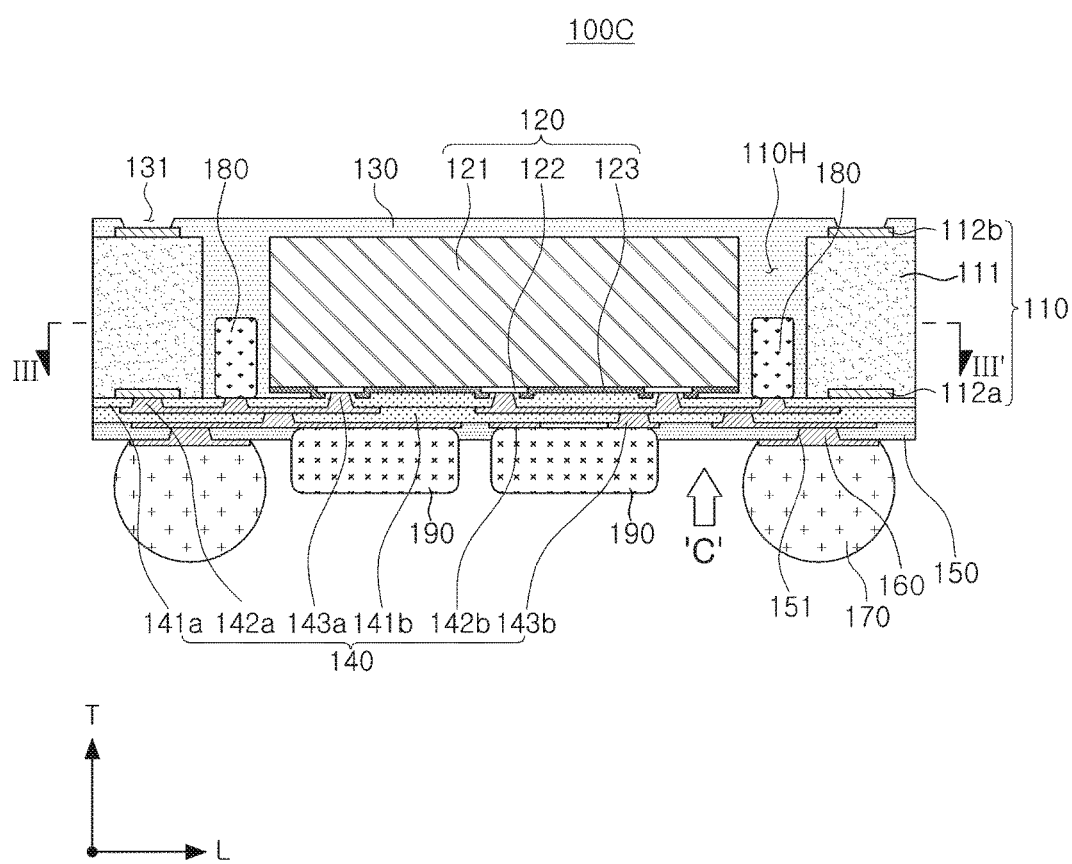
FIG. 22 is a schematic cross-sectional view illustrating another example of a fan-out semiconductor package.

FIG. 22 is a schematic cross-sectional view illustrating another example of a fan-out semiconductor package.

Figure 23:
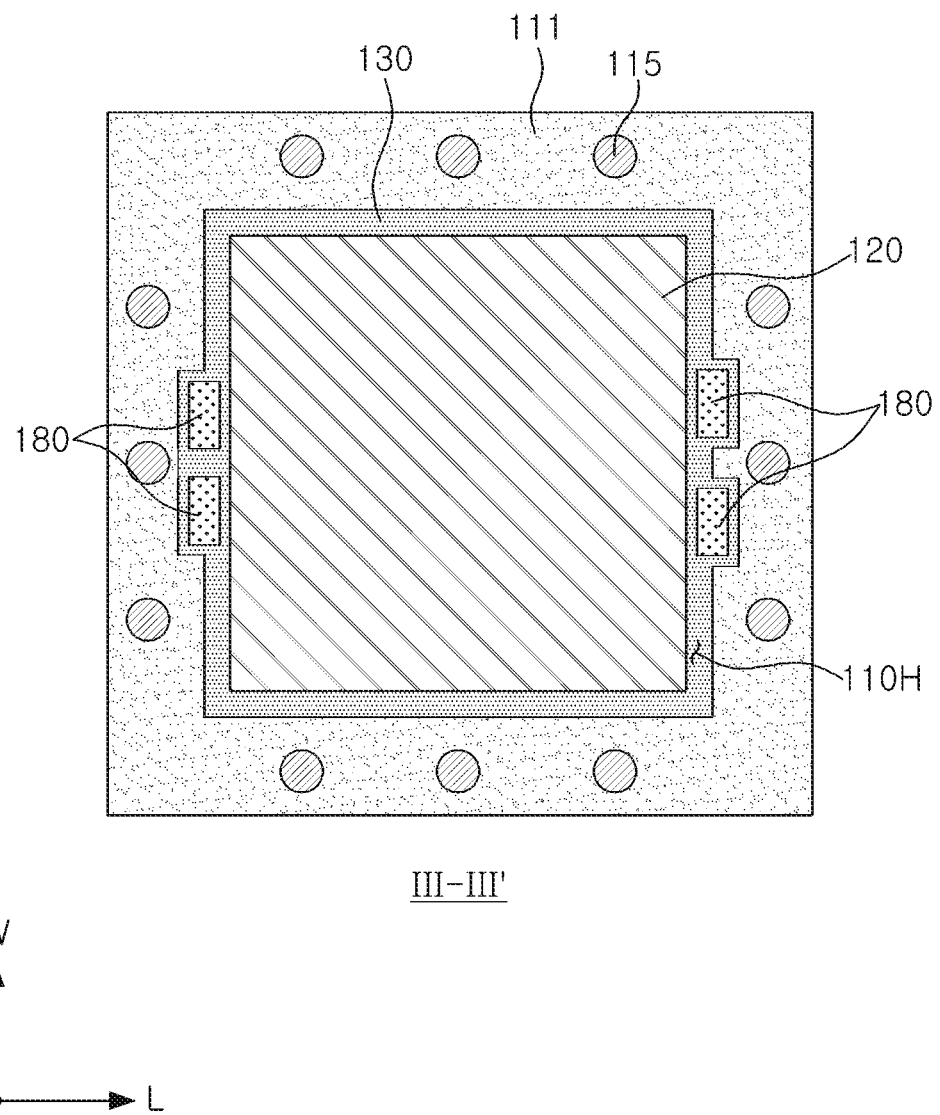
FIG. 23 is a schematic plan view taken along line III-III' of the fan-out semiconductor package of FIG. 22.

FIG. 23 is a schematic plan view taken along line III-III' of the fan-out semiconductor package of FIG. 22.

Figure 24:
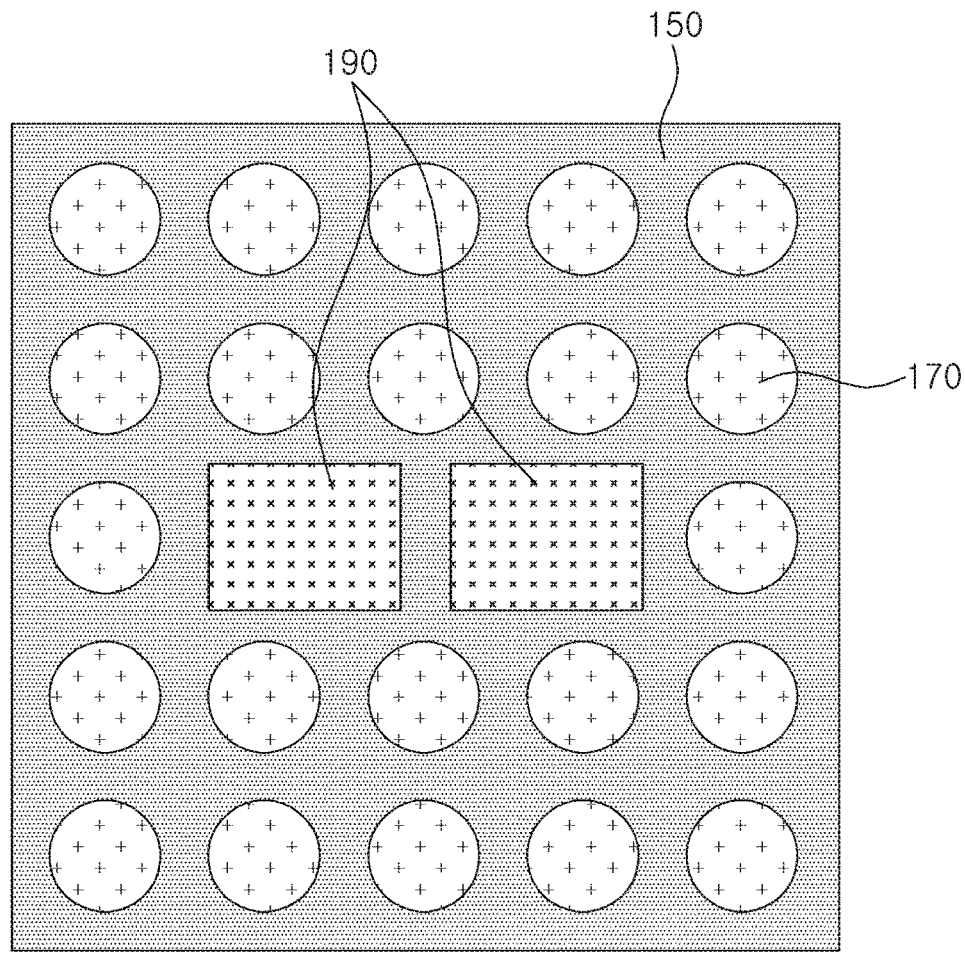
FIG. 24 is a schematic plan view illustrating the fan-out semiconductor package of FIG. 22 when viewed in direction C.
Figure 24:
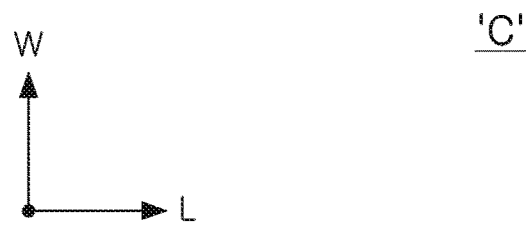

FIG. 24 is a schematic plan view illustrating the fan-out semiconductor package of FIG. 22 when viewed in direction C.

Referring to the drawings, a fan-out semiconductor package 100C may include a plurality of first capacitors 180 and a plurality of second capacitors 190. All of the plurality of first capacitors 180 and the plurality of second capacitors 190 may be commonly connected to a power wiring. In this case, the fan-out semiconductor package 100C may be particularly beneficial to ensuring capacity, and may further reduce total equivalent series impedance, resulting in improving impedance more effectively. All of the plurality of second capacitors 190 may be disposed to be surrounded by connection terminals 170 on the other surface of the first connection member 140 opposing one surface of the first connection member 140 on which the semiconductor chip 120 is disposed. For example, the plurality of second capacitors 190 may be disposed on a surface of a passivation layer 150, and may be surrounded by the connection terminals 170. A description, or the like, of other configurations except for the abovementioned configuration overlaps that described above, and is thus omitted.

Figure 25:
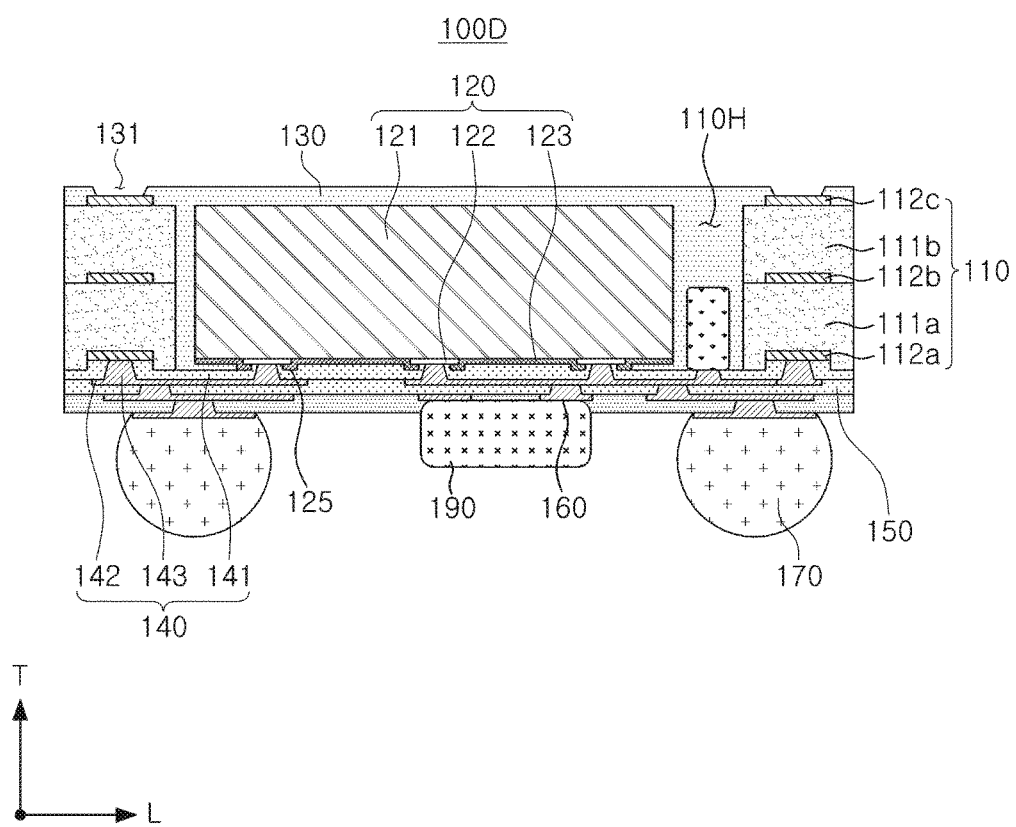
FIG. 25 is a schematic cross-sectional view illustrating another example of a fan-out semiconductor package.

FIG. 25 is a schematic cross-sectional view illustrating another example of a fan-out semiconductor package.

Referring to the drawing, in a fan-out semiconductor package 100D according to another exemplary embodiment in the present disclosure, a second connection member 110 may include a first insulating layer 111a contacting a first connection member 140, a first redistribution layer 112a contacting the first connection member 140 and embedded in the first insulating layer 111a, a second redistribution layer 112b disposed on the other surface of the first insulating layer 111a opposing one surface of the first insulating layer 111a in which the first redistribution layer 112a is embedded, a second insulating layer 111b disposed on the first insulating layer 111a and covering the second redistribution layer 112b, and a third redistribution layer 112c disposed on the second insulating layer 111b. The first to third redistribution layers 112a, 112b, and 112c may be electrically connected to connection pads 122. Meanwhile, although not illustrated in the drawing, the first and second redistribution layers 112a and 112b and the second and third redistribution layers 112b and 112c may be electrically connected to each other by first and second vias penetrating through the first and second insulating layers 111a and 111b, respectively.

Since the first redistribution layer 112a is embedded, an insulating distance of an insulating layer 141 of the first connection member 140 may be substantially constant, as described above. Since the second connection member 110 may include a large number of redistribution layers 112a, 112b, and 112c, the first connection member 140 may be further simplified. Therefore, a decrease in a yield depending on a defect occurring in a process of forming the first connection member 140 may be improved. The first redistribution layer 112a may be recessed in the first insulating layer 111a, such that a lower surface of the first insulating layer 111a and a lower surface of the first redistribution layer 112a have a step portion therebetween. Resultantly, when an encapsulant 130 is formed, a phenomenon in which a material of the encapsulant 130 is bled to pollute the first redistribution layer 112a may be prevented.

The lower surface of the first redistribution layer 112a of the second connection member 110 may be disposed on a level above a lower surface of the connection pads 122 of the semiconductor chip 120. In addition, a distance between a redistribution layer 142 of the first connection member 140 and the redistribution layer 112a of the second connection member 110 may be greater than that between the redistribution layer 142 of the first connection member 140 and the connection pads 122 of the semiconductor chip 120. The reason is that the first redistribution layer 112a may be recessed in the insulating layer 111. The second redistribution layer 112b of the second connection member 110 may be disposed on a level between an active surface and an inactive surface of the semiconductor chip 120. The second connection member 110 may be formed at a thickness corresponding to that of the semiconductor chip 120. Therefore, the second redistribution layer 112b formed in the second connection member 110 may be disposed on a level between the active surface and the inactive surface of the semiconductor chip 120.

Thicknesses of the redistribution layers 112a, 112b, and 112c of the second connection member 110 may be greater than that of the redistribution layer 142 of the first connection member 140. Since the second connection member 110 may have a thickness equal to or greater than that of the semiconductor chip 120, the redistribution layers 112a, 112b, and 112c may be formed at large sizes depending on a scale of the second connection member 110. On the other hand, the redistribution layer 142 of the first connection member 140 may be formed at a relatively smaller size for thinness.

A description, or the like, of other configurations except for the abovementioned configuration overlaps that described above, and is thus omitted. Although not illustrated in the drawing, characteristics of the fan-out semiconductor packages 100B and 100C described above may also be applied to the fan-out semiconductor package 100D.

Figure 26:
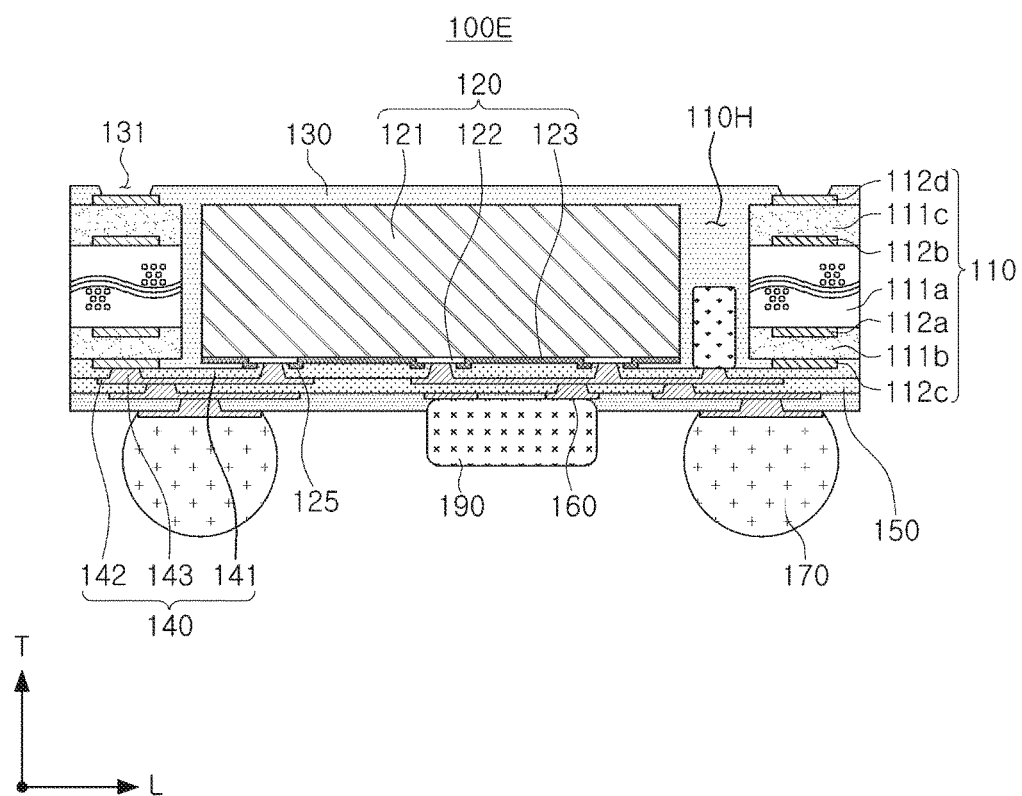
FIG. 26 is a schematic cross-sectional view illustrating another example of a fan-out semiconductor package.

FIG. 26 is a schematic cross-sectional view illustrating another example of a fan-out semiconductor package.

Referring to the drawing, in a fan-out semiconductor package 100E according to another exemplary embodiment in the present disclosure, a second connection member 110 may include a first insulating layer 111a, a first redistribution layer 112a and a second redistribution layer 112b disposed on both surfaces of the first insulating layer 111a, a second insulating layer 111b disposed on the first insulating layer 111a and covering the first redistribution layer 112a, a third redistribution layer 112c disposed on the second insulating layer 111b, a third insulating layer 111c disposed on the first insulating layer 111a and covering the second redistribution layer 112b, and a fourth redistribution layer 112d disposed on the third insulating layer 111c. The first to fourth redistribution layers 112a, 112b, 112c, and 112d may be electrically connected to connection pads 122. Since the second connection member 110 may include a larger number of redistribution layers 112a, 112b, 112c, and 112d, the first connection member 140 may be further simplified. Therefore, a decrease in a yield depending on a defect occurring in a process of forming the first connection member 140 may be improved. Meanwhile, although not illustrated in the drawing, the first to fourth redistribution layers 112a, 112b, 112c, and 112d may be electrically connected to each other by first to third vias penetrating through the first to third insulating layers 111a, 111b, and 111c.

The first insulating layer 111a may have a thickness greater than those of the second insulating layer 111b and the third insulating layer 111c. The first insulating layer 111a may basically be relatively thick in order to maintain rigidity, and the second insulating layer 111b and the third insulating layer 111c may be introduced in order to form a larger number of redistribution layers 112c and 112d. The first insulating layer 111a may include an insulating material different from those of the second insulating layer 111b and the third insulating layer 111c. For example, the first insulating layer 111a may be, for example, prepreg including a core material, an inorganic filler, and an insulating resin, and the second insulating layer 111b and the third insulating layer 111c may be an ABF film or a photosensitive insulating film including an inorganic filler and an insulating resin. However, the materials of the first insulating layer 111a and the second and third insulating layers 111b and 111c are not limited thereto.

A lower surface of the third redistribution layer 112c of the second connection member 110 may be disposed on a level below a lower surface of the connection pads 122 of the semiconductor chip 120. In addition, a distance between a redistribution layer 142 of the first connection member 140 and the third redistribution layer 112c of the second connection member 110 may be less than that between the redistribution layer 142 of the first connection member 140 and the connection pads 122 of the semiconductor chip 120. The reason is that the third redistribution layer 112c may be disposed in a protruding form on the second insulating layer 111b, resulting in contacting the first connection member 140. The first redistribution layer 112a and the second redistribution layer 112b of the second connection member 110 may be disposed on a level between an active surface and an inactive surface of the semiconductor chip 120. The second connection member 110 may be formed at a thickness corresponding to that of the semiconductor chip 120. Therefore, the first redistribution layer 112a and the second redistribution layer 112b formed in the second connection member 110 may be disposed on a level between the active surface and the inactive surface of the semiconductor chip 120.

Thicknesses of the redistribution layers 112a, 112b, 112c, and 112d of the second connection member 110 may be greater than that of the redistribution layer 142 of the first connection member 140. Since the second connection member 110 may have a thickness equal to or greater than that of the semiconductor chip 120, the redistribution layers 112a, 112b, 112c, and 112d may be formed to have large sizes. On the other hand, the redistribution layer 142 of the first connection member 140 may be formed to have relatively smaller sizes for thinness.

A description, or the like, of other configurations and a manufacturing method except for the abovementioned configuration overlaps that described above, is omitted. Although not illustrated in the drawing, characteristics of the fan-out semiconductor packages 100B and 100C described above may also be applied to the fan-out semiconductor package 100E.

Figure 27:
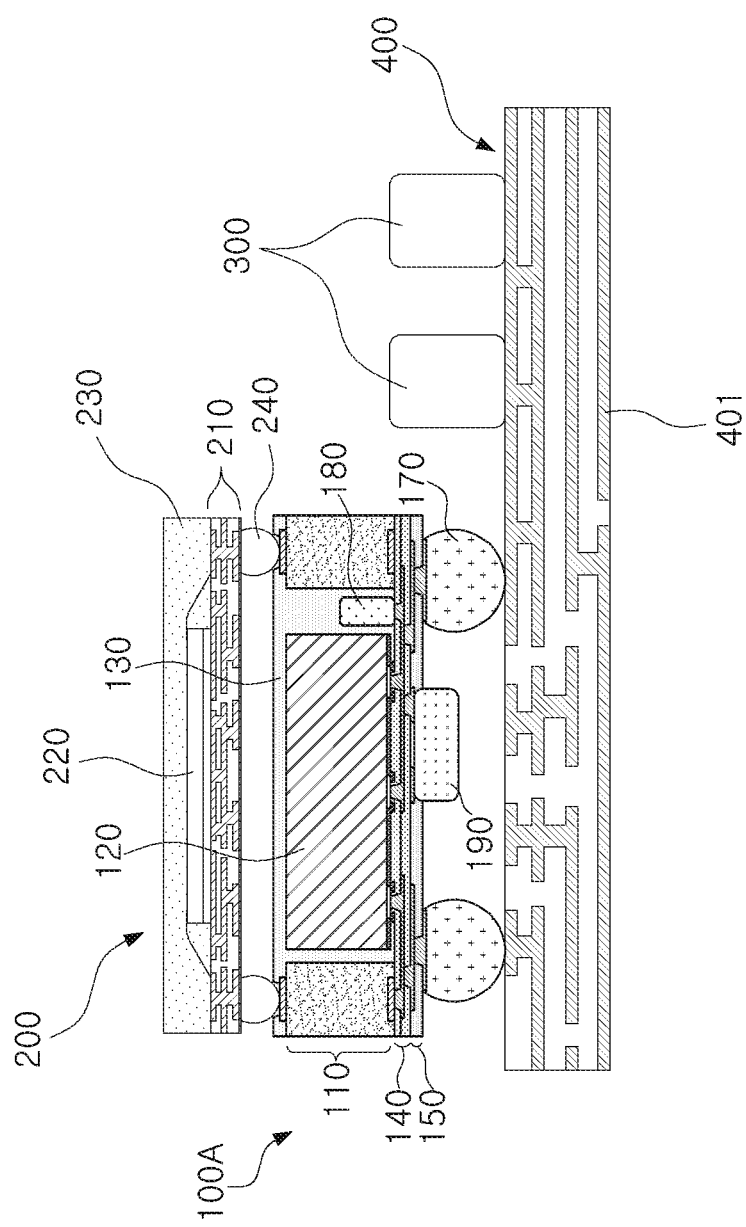
FIG. 27 is a schematic cross-sectional view illustrating an example of a case in which a fan-out semiconductor package is mounted on a main board.

FIG. 27 is a schematic cross-sectional view illustrating an example of a case in which a fan-out semiconductor package is mounted on a main board.

Referring to the drawing, an electronic device may include a main board 400, a fan-out semiconductor package 100A disposed on the main board 400, and a memory chip package 200 disposed on the fan-out semiconductor package 100A. A separate passive component 300, or the like, may be further disposed on the main board 400. The main board 400 may be a common printed circuit board (PCB) having a circuit 401, and the common PCB may be a rigid or flexible board. The fan-out semiconductor package 100A is the same as that described above, and the fan-out semiconductor package 100B, the fan-out semiconductor package 100C, the fan-out semiconductor package 100D, or the fan-out semiconductor package 100E according to another example described above may also be applied as a fan-out semiconductor package. The memory chip package 200 may include a wiring substrate 210, at least one memory chip 220 disposed on the wiring substrate 210, and an encapsulant 230 encapsulating the memory chip 220. In this case, the at least one memory chip 220 may be connected to the wiring substrate 210 by wire bonding. The passive component 300 may be a capacitor, an inductor, or the like, but is not limited thereto.

The fan-out semiconductor package 100A and the main board 400 may be electrically connected to each other by connection terminals 170. Resultantly, another passive component 300, or the like, mounted on the main board 400 may be electrically connected to the fan-out semiconductor package 100A through the circuit 401 formed in the main board 400. The fan-out semiconductor package 100A and the memory chip package 200 may also be electrically connected to each other by connection terminals 240. Resultantly, the memory chip package 200 may also be electrically connected to the main board 400 or other passive component 300. First and second capacitors 180 and 190 commonly connected to a power wiring of the fan-out semiconductor package 100A may be electrically connected to the at least one memory chip 220 through a certain power wiring in the wiring substrate 210 of the memory chip package 200. In addition, the first and second capacitors 180 and 190 may be electrically connected to a certain power wiring of the main board 400. When the passive component 300 is a capacitor, or the like, the first and second capacitors 180 and 190 may be electrically connected to the capacitor, or the like, through the certain power wiring of the main board 400. Resultantly, a level of impedance for certain power supply may be significantly reduced.

Figure 28:
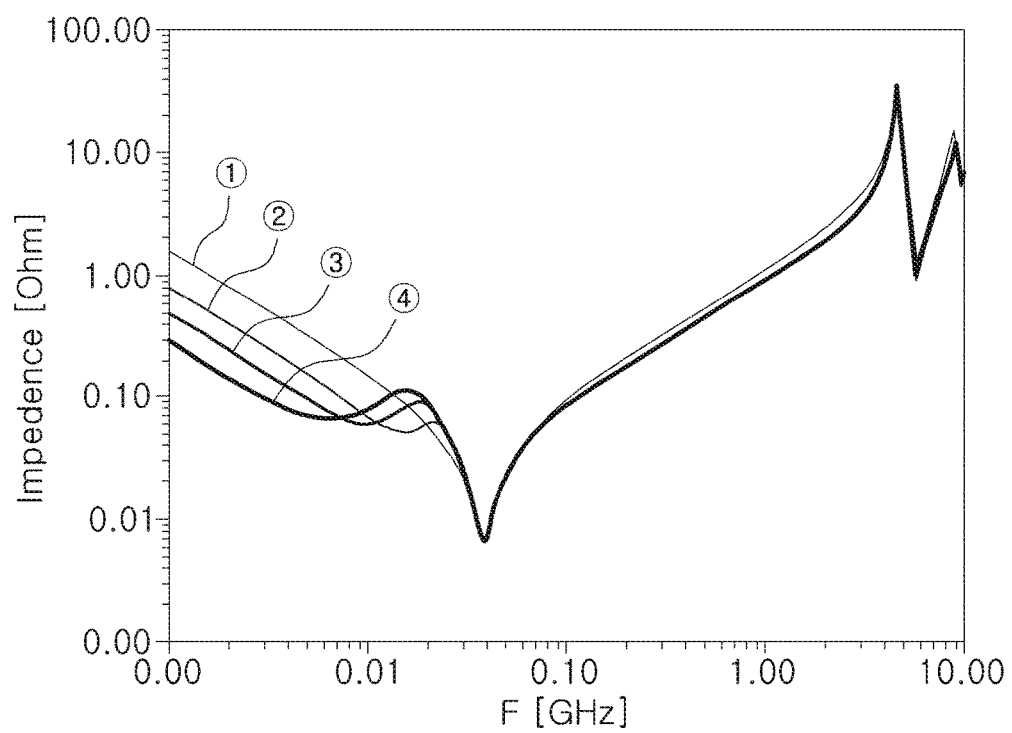
FIG. 28 is a view illustrating a change in impedance depending on a combination of first and second capacitors.

FIG. 28 is a view illustrating a change in impedance depending on a combination of first and second capacitors.

In the drawing, line ① illustrates a case in which a second capacitor 190 having a capacitance of 100 nF is connected to a power wiring without a first capacitor 180; line ② illustrates a case in which a first capacitor 180 having a capacitance of 100 nF and a second capacitor 190 having a capacitance of 100 nF are commonly connected to a power wiring; line ③ illustrates a case in which a first capacitor 180 having a capacitance of 220 nF and a second capacitor 190 having a capacitance of 100 nF are commonly connected to a power wiring; and line ④ illustrates a case in which a first capacitor 180 having a capacitance of 470 nF and a second capacitor 190 having a capacitance of 100 nF are commonly connected to a power wiring. A method of increasing a capacitance of the first capacitor 180 may be a method of increasing a capacitance of the first capacitor 180 itself or a method of increasing the number of first capacitors 180. Referring to the drawings, impedance may be reduced as a total capacitance of the first capacitor 180 is increased by raising a capacitance of the first capacitor 180. In this case, since the second capacitor 190 remains fixed, it can be understood that the impedance may be improved in a limited space without a reduction in a region in which the connection terminals 170 may be disposed.

As set forth above, according to exemplary embodiments in the present disclosure, a fan-out semiconductor package that may improve levels of input impedance in a low frequency domain and a high frequency domain regardless of a limited capacitor space may be provided.

While embodiments have been shown and described above, it will be apparent to those skilled in the art that modifications and variations could be made without departing from the scope of the present disclosure as defined by the appended claims.

What is claimed is:

1. A fan-out semiconductor package comprising:
a semiconductor chip having an active surface having connection pads disposed thereon and an inactive surface disposed to oppose the active surface;
a first capacitor disposed adjacently to the semiconductor chip;
an encapsulant at least partially encapsulating the inactive surface of the semiconductor chip and the first capacitor;
a first connection member disposed on the encapsulant, the first capacitor, and the active surface of the semiconductor chip, and
a second capacitor disposed on the other surface of the first connection member opposing one surface of the first connection member on which the semiconductor chip is disposed,
wherein the first connection member includes a redistribution layer electrically connected to one of the connection pads of the semiconductor chip, the first capacitor, and the second capacitor, and
the first capacitor and the second capacitor are electrically connected to the one of the connection pads of the semiconductor chip through a common power wiring of the redistribution layer.

2. The fan-out semiconductor package of claim 1, wherein $C_1$ is equal to $C_2$, in which $C_1$ and $C_2$ are capacitances of the first and second capacitors, respectively.

3. The fan-out semiconductor package of claim 1, wherein $t_1$ is greater than $t_2$, in which $t_1$ and $t_2$ are thicknesses of the first and second capacitors, respectively.

4. The fan-out semiconductor package of claim 1, wherein $L_1$ is equal to $L_2$, in which $L_1$ and $L_2$ are equivalent series inductances (ESL) of the first and second capacitors, respectively.

5. The fan-out semiconductor package of claim 1, wherein $R_1$ is equal to $R_2$, in which $R_1$ and $R_2$ are equivalent series resistances (ESR) of the first and second capacitors, respectively.

6. The fan-out semiconductor package of claim 1, wherein the first and second capacitors are connected to each other in parallel.

7. The fan-out semiconductor package of claim 1, further comprising a passivation layer disposed on the other surface of the first connection member opposing the one surface of the first connection member on which the semiconductor chip is disposed and having openings exposing at least a portion of a wiring of the redistribution layer,
wherein the second capacitor is disposed on a surface of the passivation layer.

8. The fan-out semiconductor package of claim 7, further comprising connection terminals disposed in the openings of the passivation layer,
wherein the connection terminals are disposed to surround the second capacitor and are electrically connected to other connection pads of the connection pads of the semiconductor chip.

9. The fan-out semiconductor package of claim 1, further comprising a second connection member having a through-hole disposed on the second connection member,
wherein the semiconductor chip and the first capacitor are disposed in the through-hole,
the encapsulant covers an upper surface of the second connection member, and extends continuously from the upper surface of the second connection member and the inactive surface of the semiconductor chip to directly contact with the first connection member by passing the through-hole,
the encapsulant directly covers upper and side surfaces of the first capacitor and side surfaces of the semiconductor chip connecting the active and inactive surfaces to each other, and
a lower surface of the first capacitor opposing the upper surface of the first capacitor is in contact with the first connection member, and a lower surface of the second connection member opposing the upper surface of the second connection member is in contact with the first connection member.

10. The fan-out semiconductor package of claim 9, wherein the second connection member includes a first insulating layer, a first redistribution layer contacting the first connection member and embedded in the first insulating layer, and a second redistribution layer disposed on the other surface of the first insulating layer opposing one surface of the first insulating layer in which the first redistribution layer is embedded, and
the first and second redistribution layers are electrically connected to the connection pads.

11. The fan-out semiconductor package of claim 10, wherein the second connection member further includes a second insulating layer disposed on the first insulating layer and covering the second redistribution layer and a third redistribution layer disposed on the second insulating layer, and
the third redistribution layer is electrically connected to the connection pads.

12. The fan-out semiconductor package of claim 10, wherein a distance between the redistribution layer of the first connection member and the first redistribution layer is greater than that between the redistribution layer of the first connection member and the connection pads.

13. The fan-out semiconductor package of claim 10, wherein the first redistribution layer is thicker than the redistribution layer of the first connection member.

14. The fan-out semiconductor package of claim 10, wherein a lower surface of the first redistribution layer is disposed on a level above lower surfaces of the connection pads.

15. The fan-out semiconductor package of claim 11, wherein the second redistribution layer is disposed on a level between the active surface and the inactive surface of the semiconductor chip.

16. The fan-out semiconductor package of claim 9, wherein the second connection member includes a first insulating layer, a first redistribution layer and a second redistribution layer disposed on both surfaces of the first insulating layer, a second insulating layer disposed on the first insulating layer and covering the first redistribution layer, and a third redistribution layer disposed on the second insulating layer, and
the first to third redistribution layers are electrically connected to the connection pads.

17. The fan-out semiconductor package of claim 16, wherein the second connection member further includes a third insulating layer disposed on the first insulating layer and covering the second redistribution layer and a fourth redistribution layer disposed on the third insulating layer, and the fourth redistribution layer is electrically connected to the connection pads.

18. The fan-out semiconductor package of claim 16, wherein the first insulating layer is thicker than the second insulating layer.

19. The fan-out semiconductor package of claim 16, wherein the third redistribution layer is thicker than the redistribution layer of the first connection member.

20. The fan-out semiconductor package of claim 16, wherein the first redistribution layer is disposed on a level between the active surface and the inactive surface of the semiconductor chip.

21. The fan-out semiconductor package of claim 16, wherein a lower surface of the third redistribution layer is disposed on a level below lower surfaces of the connection pads.

22. The fan-out semiconductor package of claim 1, wherein the first connection member includes an insulating layer in direct contact with the first capacitor, and vias penetrating through the insulating layer and directly connected to the connection pads of the semiconductor chip and the first capacitor, respectively.

23. The fan-out semiconductor package of claim 22, wherein two of the vias respectively connected to the first capacitor and the one of the connection pads of the semiconductor chip are directly connected to the common power wiring.

24. The fan-out semiconductor package of claim 1, wherein in a stacking direction of the first connection member and the semiconductor chip, the common power wiring overlaps with the one of the connection pads of the semiconductor chip, at least a portion of the first capacitor, and at least a portion of the second capacitor.

* * * * *